(12) United States Patent
Hashimoto

(10) Patent No.: US 10,827,090 B1
(45) Date of Patent: Nov. 3, 2020

(54) ELECTRONIC DEVICE AND METHOD FOR OPERATING ELECTRONIC DEVICE

(71) Applicant: Innolux Corporation, Miao-Li County (TW)

(72) Inventor: Kazuyuki Hashimoto, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 16/571,192

(22) Filed: Sep. 16, 2019

(51) Int. Cl.
*H04N 1/028* (2006.01)
*H01L 27/32* (2006.01)
*H01L 27/146* (2006.01)

(52) U.S. Cl.
CPC ... *H04N 1/02805* (2013.01); *H01L 27/14609* (2013.01); *H01L 27/14643* (2013.01); *H01L 27/3276* (2013.01)

(58) Field of Classification Search
CPC ...... G06F 3/044; G06F 3/0418; G06F 3/0412; G06F 3/0416; G06F 11/1068; G06F 1/266; G06F 11/2094; G06F 1/263; G06F 2201/82; G06F 2203/04105; G06F 3/0414; G06F 1/28; G06F 1/30; G06F 1/3287; G06F 2203/04103; G06F 2203/04104; G06F 2203/04106; G06F 3/03545; G06F 3/045; G06F 3/046; G06F 3/047; G06F 1/04; G06F 1/1662; G06F 1/169; G06F 1/1694; G06F 1/26; G06F 1/3212; G06F 1/3262; G06F 1/3265; G06F 2200/1614; G06F 2203/04101; G06F 2203/04107; G06F 2203/04108; G06F 3/03547; G06F 3/04886; G06F 3/0619; G06F 3/0659; G06F 3/0679; H04N 5/378; H04N 3/1512; H04N 5/23245; H04N 5/335; H04N 5/374; H04N 5/2253; H04N 5/37455; H04N 5/37457
USPC .......................................... 358/474, 482, 483
See application file for complete search history.

(56) References Cited

U.S. PATENT DOCUMENTS

| | | | |
|---|---|---|---|
| 6,166,367 A * | 12/2000 | Cho ..................... | H04N 5/335 250/208.1 |
| 8,228,410 B2 | 7/2012 | Raynor et al. | |
| 8,698,932 B2 * | 4/2014 | Hirota ............... | H01L 27/14645 348/308 |
| 10,573,254 B2 * | 2/2020 | Yoshiga ............... | H05B 33/08 |
| 2001/0008422 A1 * | 7/2001 | Mizuno ................ | H04N 5/3575 348/302 |
| 2010/0073294 A1 * | 3/2010 | Kim ..................... | G06F 3/03542 345/166 |
| 2011/0285888 A1 * | 11/2011 | Okuda .................. | H04N 5/374 348/302 |
| 2013/0208110 A1 * | 8/2013 | Wang ................... | H04N 5/2353 348/143 |
| 2014/0291533 A1 * | 10/2014 | Oda ........................ | H04N 5/32 250/370.07 |

(Continued)

*Primary Examiner* — Negussie Worku
(74) *Attorney, Agent, or Firm* — JCIPRNET

(57) ABSTRACT

A sensor device includes a data line, a current source connected to the data line, a current sink connected to the data line, and a charge integrator connected to the data line, receiving a sensing current from the data line and outputting a sensing voltage. The sensing current is a summation of a current from the current source to the charge integrator and a current from the current sink to the charge integrator.

20 Claims, 22 Drawing Sheets

(56) References Cited

U.S. PATENT DOCUMENTS

| | | | |
|---|---|---|---|
| 2015/0084943 A1* | 3/2015 | Kim | H05B 45/44 |
| | | | 345/212 |
| 2015/0357357 A1* | 12/2015 | Sargent | H04N 5/378 |
| | | | 250/208.1 |
| 2016/0050378 A1* | 2/2016 | Wu | G06K 9/00013 |
| | | | 348/77 |
| 2016/0150165 A1* | 5/2016 | Grauer | H01L 27/14621 |
| | | | 348/280 |
| 2016/0344965 A1* | 11/2016 | Grauer | H04N 5/353 |
| 2017/0018932 A1* | 1/2017 | Pahlevaninezhad | H02J 3/381 |
| 2017/0350756 A1* | 12/2017 | Panicacci | G01J 1/4228 |
| 2018/0109213 A1* | 4/2018 | Saw | H02P 8/22 |
| 2018/0367897 A1* | 12/2018 | Bjork | G01K 7/16 |
| 2020/0186090 A1* | 6/2020 | Choi | H03F 1/0205 |

* cited by examiner

ELECTRONIC DEVICE AND METHOD FOR OPERATING ELECTRONIC DEVICE

BACKGROUND

Technical Field

The disclosure generally relates to an electronic device and a method for operating an electronic device, and more particularly to a sensor device and a method for operating a sensor device.

Description of Related Art

In a sensor device, sensor output has a dependency of a secondary parameter, offset and aging effect besides a dependency of a primary parameter. For example, the photodiode current has light dependency as primary, temperature dependency as secondary and dark current as offset. These factors should be eliminated for accurate measurement of primary parameter.

In related arts, for providing those factors, additional photodiode for each sensor pixel may cause resolution (pixels per inch, ppi) disadvantage, additional ROM and the temperature sensor may cause cost up.

SUMMARY

The disclosure is related to a sensor device and a method for operating a sensor device, capable of contributing sensing accuracy, spatial resolution or cost reduction.

The disclosure provides a sensor device. The sensor device comprises a data line, a current source connected to the data line, a current sink connected to the data line, and a charge integrator connected to the data line, receiving a sensing current from the data line and outputting a sensing voltage. The sensing current is a summation of a current from the current source to the charge integrator and a current from the current sink to the charge integrator.

The disclosure provides a method for operating a sensor device. The sensor device comprising a data line, a first scan line, a second scan line, a current source connected to the data line and the first scan line, a current sink connected to the data line and the second scan line, and a charge integrator connected to the data line. The method comprises: simultaneously scanning the first scan line and the second scan line; receiving a current from the current source to the charge integrator through the data line and a current from the current sink to the charge integrator through the data line for summarizing a sensing current; and outputting a sensing voltage by the charge integrator related to the sensing current.

The disclosure provides a method for operating a sensor device. The sensor device comprises a data line, a scan line, a current source connected to the data line and the scan line, a current sink connected to the data line and the scan line, and a charge integrator connected to the data line. The method comprising: scanning the scan line; receiving a current from the current source to the charge integrator through the data line and a current from the current sink to the charge integrator through the data line for summarizing a sensing current; and outputting a sensing voltage by the integrator related to the sensing current.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure, and together with the description, serve to explain the principles of the disclosure.

DESCRIPTION OF THE EMBODIMENTS

Figure 1A:
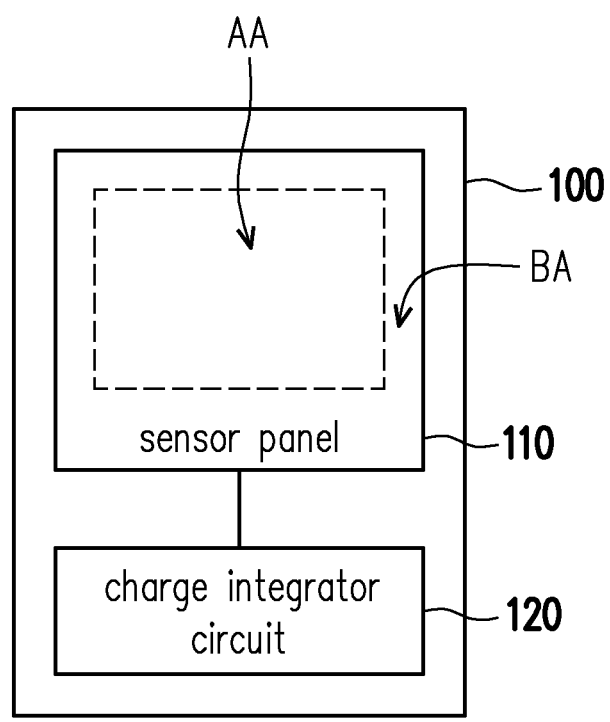
FIG. 1A illustrates a schematic diagram of a sensor device according to an embodiment of the disclosure.

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

Electronic device may be one of display device, antenna device, sensing device or tiled device, but not be limited thereto. Electronic device may be flexible or foldable devices. Electronic device may be light-sensor (photo-sensor) device, pressure-sensor device, ultrasonic-sensor device, piezoresistive-sensor device, temperature-sensor device, capacitance-sensor device, gravity-sensor device, image-sensor device, vibration-sensor device, gas-sensor device, hall-effect-sensor device, etc. Electronic device may be liquid crystal display device, organic light emitting diode display device (OLED), inorganic light emitting diode display device (LED), minimeter-sized light emitting diode display device (mini-LED), micrometer-sized light emitting diode display device (micro-LED), quantum dot light emitting diode display device (QLED), but not be limited thereto. Antenna device may be liquid crystal antenna device, but not be limited thereto. Splicing device may be tiled display device or tiled antenna device, but not be limited thereto.

In a disclosure, the embodiments use "pixel" or "pixel unit" as a unit for describing a specific region including at least one functional circuit for at least one specific function. Describing "pixel with circuit" as "circuit" is available for a disclosure. For example, a "pixel with current source" may be described as a "current source", or a "pixel with current sink" may be described as a "current sink". The region of a "pixel" is depended on a unit for providing a specific function, adjacent pixels may share the same parts or wires, but may also include its own specific parts therein. For example, adjacent pixels may share a same scan line or a same data line, but the pixels may also have their own transistors or capacitance.

In a disclosure, a current source circuit is a circuit unit for outputting current, and a current sink is a circuit unit for draining current. The adjacent circuit units may share the same parts or wires and may also include its specific parts therein.

It should be noted that the technical features in different embodiments described in the following can be replaced, recombined, or mixed with one another to constitute another embodiment without departing from the spirit of a disclosure.

Figure 1B:
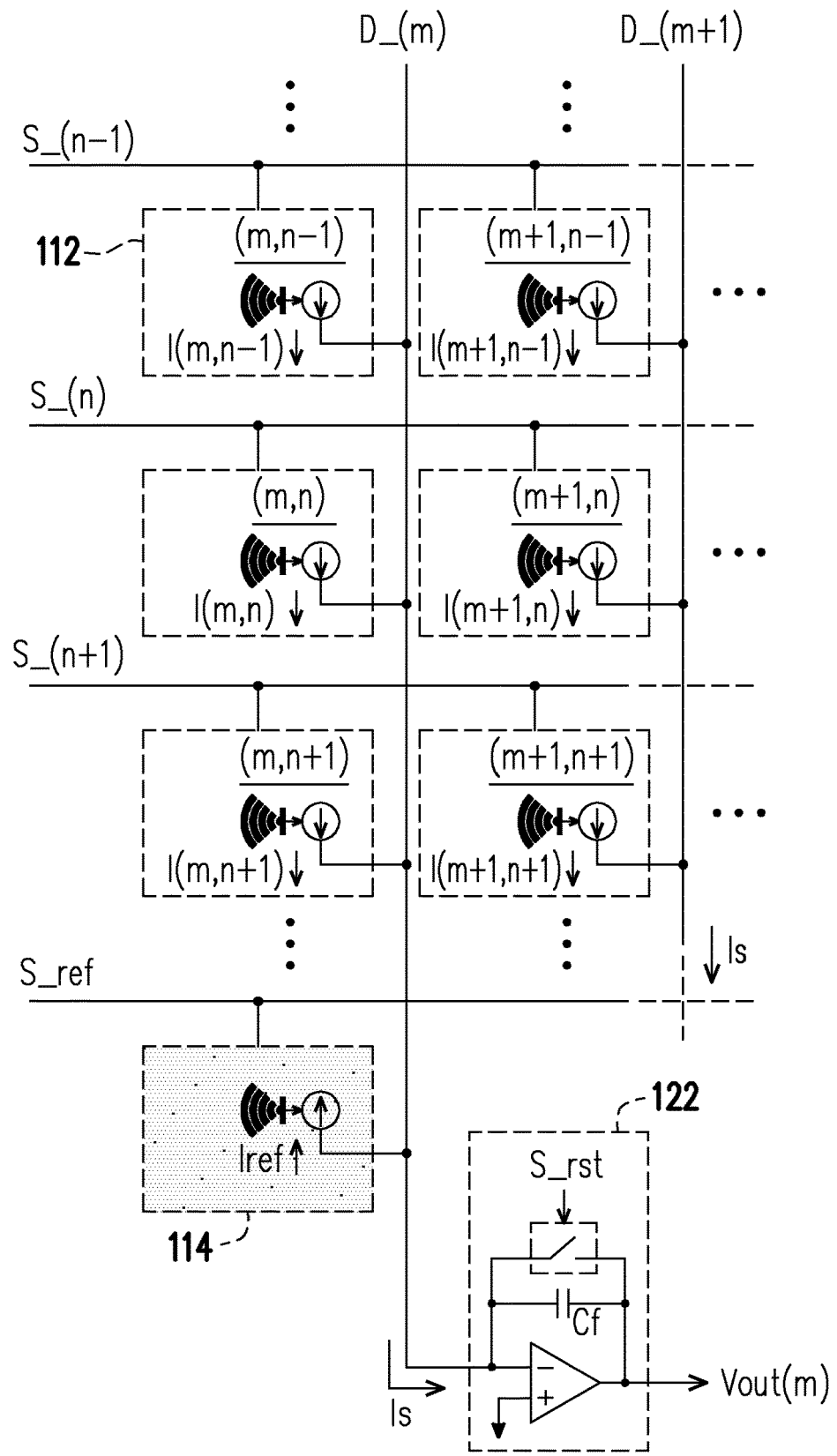
FIG. 1B illustrates a schematic diagram of a sensor array and a charge integrator according to an embodiment of the disclosure.
Figure 1C:
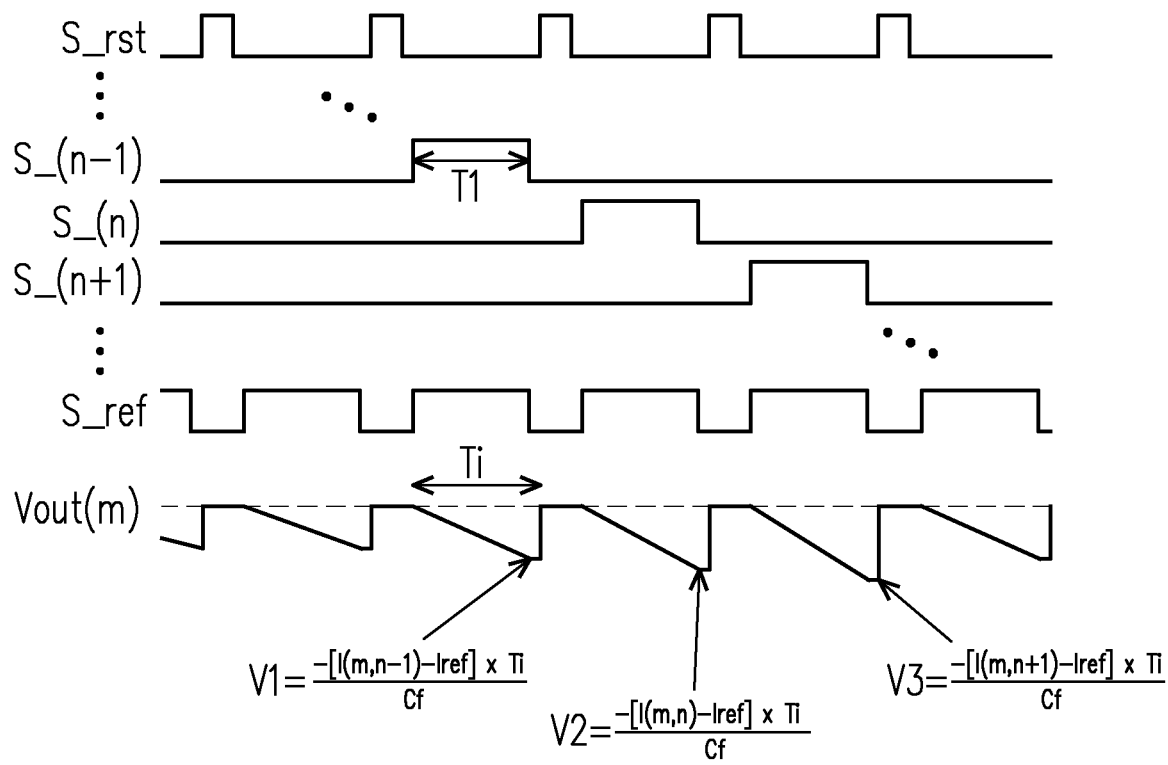
FIG. 1C illustrates a waveform diagram of signals depicted in FIG. 1B.

FIG. 1A illustrates a schematic diagram of a sensor device according to an embodiment of the disclosure. FIG. 1B illustrates a schematic diagram of a sensor array and a charge integrator according to an embodiment of the disclosure. FIG. 1C illustrates a waveform diagram of signals depicted in FIG. 1B. Referring to FIG. 1A to FIG. 1C, the sensor device 100 includes a sensor panel 110 and a charge integrator circuit 120 connected to the sensor panel 110. The sensor panel 120 includes a plurality of data lines including D_(m) and D_(m+1), a plurality of scan lines including S_(n−1), S_(n), and S_(n+1), scan line S_ref, a plurality of current sources and a plurality of current sinks. In an embodiment, the current source are used for sensing (sensor) and may be exposed, and the current sinks are used for providing reference and may be shielded. At least one current source and at least one current sink are connected to corresponding one data line, e.g., data line D_(m) or data line D_(m+1). The at least one current source corresponding to a data line refer to at least one current sink corresponding to the same data line. In an embodiment, each row of current source is driven by the corresponding scan line, e.g., scan line S_(n−1), scan line S_(n), or scan line S_(n+1). The row of current sink at terminals of the data lines may be driven by the scan line S_ref. Along an extending direction of the data lines D_(m), the current source of (m, n) is located between the current sink and the current source of (m, n−1). In another embodiment, current source may be used for referencing, current sink may be used for sensing, and one data line corresponds to at least one sensing unit and at least one reference unit. In an embodiment, data lines may be extended in column direction and scan lines may be extended in row direction. In another embodiment, data lines may be extended in row direction and scan lines may be extended in column direction.

Referring to FIG. 1A to FIG. 1C again, the sensor panel 120 may further includes a plurality of sensor pixels 112, and reference pixel 114. In another embodiment, the pixel could be omitted. In an embodiment, presented in pixel point of view, the sensor pixels 112 may have current source and serve as sensor pixels for sensing and may be exposed, and the reference pixel 114 may have current sink and serve as reference pixel for providing reference and may be shielded. The sensor pixels 112 and the reference pixel 114 are connected to corresponding one data line, e.g., data line D_(m) or data line D_(m+1). The sensor pixels 112 corresponding to the same data line refer to the corresponding one reference pixel 114. Each row of sensor pixels 112 is driven by the corresponding scan line, e.g., scan line S_(n−1), scan line S_(n), or scan line S_(n+1). The row of reference pixels 114 at terminals of the data lines may be driven by the scan line S_ref. Along an extending direction of the data lines D_(m), the sensor pixel of (m, n) is located between the reference pixel 114 and the sensor pixel of (m, n−1). In another embodiment, sensor pixel 112 may be used for sensing or referencing, and one data line corresponds to at least one sensor pixel and at least one reference pixel. In an embodiment, data lines may be extended in column direction and scan lines may be extended in row direction. In another embodiment, data lines may be extended in row direction and scan lines may be extended in column direction.

In an embodiment, the sensor pixels 112 may be located corresponding to grids formed by intersecting the data lines D_(m) and D_(m+1) and the scan lines S_(n−1) to S_(n+1), and the sensor pixels 112 are arranged to form a sensor array. Along an extending direction of the data lines D_(m), the sensor pixel 112 of (m, n) is located between the reference pixel 114 and the sensor pixel 112 of (m, n−1). The locations of other sensor pixels 112 can be deduced by analogy. In an embodiment, the sensor array may be integrated into an electronic device. The electronic device may be a sensor device, a display device, a tiled device or combination thereof. The display device may comprise liquid-crystal or LED. The LED device may comprise OLED, Q-LED, mini-LED or micro-LED, and the disclosure is not limited thereto.

The charge integrator circuit 120 is connected to the sensor panel 110 and adjacent to the sensor panel 110. The charge integrator circuit 120 includes a plurality of charge integrators 122. Each of the charge integrators 122 is connected to a respective data line. For example, the charge integrator 122 depicted in FIG. 1B is connected to the data line D_(m), and another charge integrator (not shown) is connected to the data line D_(m+1). In an embodiment, each of the data lines in the sensor panel 110 has a respective charge integrator connected thereto. In another embodiment, part of the data lines in the sensor panel 110 has a respective charge integrator connected thereto.

In an embodiment, current sources output currents to the charge integrator 122. For example, the current sources of (m, n−1), (m, n) and (m, n+1) corresponding to the data line D_(m) are respectively configured to output the currents I(m, n−1), I(m, n) and I(m, n+1) to the charge integrator 122 during different sensing periods T1 while Scan line S_(n−1), Scan line S_(n), and Scan line S_(n+1) are sequentially scanned (selected) to enable the current sources of (m, n−1), (m, n) and (m, n+1) corresponding to the data line D_(m). The current sources of (m, n−1), (m, n) and (m, n+1) are connected to the data line D_(m) and the corresponding charge integrator 122. The current sink drains a reference current Iref from the charge integrator 122. The charge integrator 122 could summarize the current from current source to charge integrator 122 and the current from current sink to the charge integrator 122 through the data line. In an embodiment, the current source is used for sensing (sensor) and current sink is used for reference. In other embodiments, the current source is used for reference and current sink is used for sensing (sensor). In an embodiment, there are a plurality of current sources and one current sink. In other embodiments, there may be more than one current sink corresponding to one data line and related current sources. In an embodiment, the current source is exposed and the current sink is shielded. For example, a light shield may be used to shield a photodiode of the current sink, such that the current sink is insensitive to light. In other embodiments, the current sink may not be shielded. The sensor panel 110 includes an active area AA and a border area BA, the border area BA is around out of the active area AA. The current sources are located in the active area AA, and the current sink is located in the border area BA. In other embodiments, the current sink may be located in the active area AA. In an embodiment, presented in pixel point of view, each of the sensor pixels 112 and reference pixels 114 has an identical sensor. The sensor pixels 112 have current sources and output pixel currents to the charge integrator 122. For example, the sensor pixels 112 of (m, n−1), (m, n) and (m, n+1) corresponding to the data line D_(m) are respectively configured to output the pixel currents I(m, n−1), I(m, n) and I(m, n+1) to the charge integrator 122 during different sensing periods T1 while Scan line S_(n−1), Scan line S_(n), and Scan line S_(n+1) are sequentially scanned (selected) to enable the sensor pixels 112 of (m, n−1), (m, n) and (m, n+1) corresponding to the data line D_(m). The current sources of the sensor pixels 112 of (m, n−1), (m, n) and (m, n+1) are connected to the data line D_(m) and the corresponding charge integrator 122. The reference pixel 114 has a current sink and drains a reference current Iref from the charge integrator 122. The charge integrator 122 could summarize the current from sensor pixel 112 to charge integrator 122 and the current from reference pixel 114 to the charge integrator 122 through the data line. In an embodiment, the sensor pixels 112 include current sources while the reference pixel 114 includes current sink. In other embodiments, the sensor pixels may include current sinks while the reference pixel 114 includes current source. In other embodiments, there may be more than one reference pixel 114 corresponding to one data line and related sensor pixels 112. In an embodiment, the sensor pixels 112 are exposed and the reference pixel 114 is shielded. For example, a light shield may be used to shield a photodiode of the reference pixel 114, such that the reference pixel 114 is insensitive to light. In other embodiments, the reference pixel 114 may not be shielded. The sensor panel 110 includes an active area AA and a border area BA, the border area BA is around out of the active area AA. The sensor pixels 112 are located in the active area AA, and the reference pixel 114 is located in the border area BA. In other embodiment, the reference pixel 114 may be located in the active area AA.

In an embodiment, the current sources of (m, n−1), (m, n) and (m, n+1) are connected to the same data line D_(m) and share the same current sink and the same charge integrator 122. For each sensing period T1, at least one of the current sources of (m, n−1), (m, n) and (m, n+1) serves for sensing to be detected. The current sink and the at least one current source of (m, n−1), (m, n) and (m, n+1) are simultaneously scanned (selected) to enabled by the scan lines S_(n−1), S_(n), and S_(n+1). In another embodiment, presented in pixel point of view, the sensor pixels 112 of (m, n−1), (m, n) and (m, n+1) having current sources are connected to the same data line D_(m) and share the same reference pixel 114 and the same charge integrator 122. For each sensing period T1, at least one of the sensor pixels 112 of (m, n−1), (m, n) and (m, n+1) serves as a sensor pixel to be detected. The reference pixel 114 and the at least one of the sensor pixels 112 of (m, n−1), (m, n) and (m, n+1) are simultaneously selected to enabled by the scan lines S_(n−1), S_(n), and S_(n+1) for summarizing a sensing current. The charge integrator 122 receives a sensing current Is from the data line D_(m). The sensing current Is is a summation of at least one pixel current I(m, n−1), I(m, n) or I(m, n+1) and the reference current Iref, i.e. Is=I(m, n−1)+(−Iref) or Is=I(m, n)+(−Iref) or Is=I(m, n+1)+(−Iref), where "−Iref" indicates the reference current Iref drained from the charge integrator 122. I(m, n−1), I(m, n), I(m, n+1) and Iref are positive value, and + or − means current to charge integrator or current from charge integrator. Current from current source to charge integrator is positive (+), and current from current sink to charge integrator is negative (−). Next, the charge integrator 122 converts the sensing current Is into an output voltage Vout(m) and then output.

To be specific, referring to FIG. 1C, a reset signal S_rst is configured to reset the charge integrator 122 for each sensing period T1. In an embodiment, the scan lines S_(n−1) to S_(n+1) are sequentially selected (selected). For the first sensing period T1, the current sources of (m, n−1) and (m+1, n−1) corresponding to the scan line S_(n−1) served for sensing can be detected. Taking the data line D_(m) for example, scanning the current source of (m, n−1) and the current sink during the first sensing period T1. Through the data line D_(m), the current source of (m, n−1) outputs the current I(m, n−1) to the charge integrator 122, and the current sink drains the reference current Iref from the charge integrator 122. In another embodiment, presented in pixel point of view, the scan lines S_(n−1) to S_(n+1) are sequentially selected. For the first sensing period T1, the sensor pixel 112 of (m, n−1) and (m+1, n−1) on the scan line S_(n−1) are the sensor pixels to be detected. Taking the data line D_(m) for example, scanning the sensor pixel 112 of (m, n−1) and the reference pixel 114 during the first sensing period T1. Through the data line D_(m), the sensor pixel 112 of (m, n−1) having current source outputs the pixel current I(m, n−1) to the charge integrator 122, and the reference pixel 114 having current sink drains the reference current Iref from the charge integrator 122 for summarizing a sensing current. Accordingly, the sensing current Is is a summation of the pixel current I(m, n−1) and the reference current Iref, i.e. Is=I(m, n−1)+(−Iref), where "−Iref" indicates the reference current Iref drained from the charge integrator 122. Next, the charge integrator 122 converts the sensing current Is into the output voltage Vout(m) during an integration time Ti. In this case, the output voltage Vout(m) is equal to V1 as denoted in FIG. 1C. Similarly, during the second sensing period T1, the output voltage Vout(m) of the current source or the sensor pixel 112 of (m, n) on the scan line S_(n) is equal to V2 as denoted in FIG. 1C. During the third sensing period T1, the output voltage Vout(m) of the current source or the sensor pixel 112 of (m, n+1) on the scan line S_(n+1) is equal to V3 as denoted in FIG. 1C. The output voltage Vout(i) can be calculated based on the formula: $Vout(i)=-Is \times Ti/Cf=-[I(i,j)-Iref] \times Ti/Cf$, Is is a sensing current, I(i,j) is a current corresponding to data line D_(i) and scan line S_(j) wherein i and j are positive integrals, T1 is an integration time of the charge integrator 122 wherein T1 could the same with or different from Ti, and Cf is capacitance of the charge integrator 122. V1 is $-[I(m,n-1)-Iref] \times Ti/Cf$, V2 is $-[I(m,n)-Iref] \times Ti/Cf$, and V3 is $-[I(m,n+1)-Iref] \times Ti/Cf$. For the data lines D_(m+1), the output voltage Vout(m+1) (not shown) of the current source or the sensor pixels 112 of (m+1, n−1), (m+1, n) and (m+1, n+1) respectively on the scan lines S_(n−1), S_(n) and S_(n+1) can be deduced by analogy.

As shown in FIG. 1C, the sensor device 100 operates in a row-by-row differential read-out scheme with one scan line by sequentially selecting the current sources or the sensor pixels 112 to be detected on one of the scan lines. Common components of the current source, current source, or the sensor pixels 112, e.g. temperature dependency and dark current of photodiode, are compensated by subtraction, and then sensed physical value, e.g. photocurrent of photodiode, is reported. In addition, it is contributes a high pixels per inch (ppi) sensor array to share the sensor pixel and the charge integrator in column.

Figure 1D:
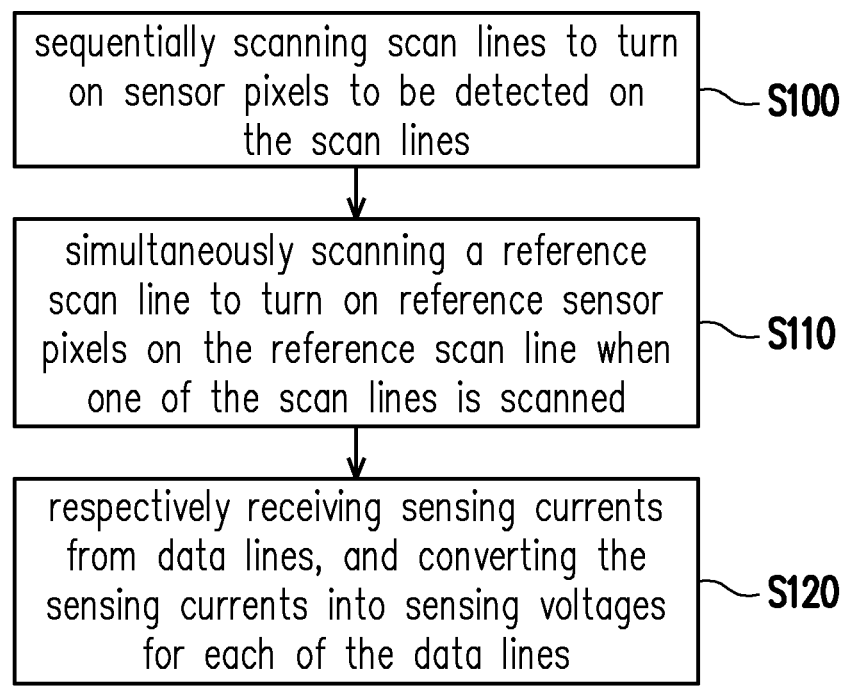
FIG. 1D is a flowchart illustrating steps in a method of operating a sensor device according to an embodiment of the disclosure.

FIG. 1D is a flowchart illustrating steps in a method of operating a sensor device according to an embodiment of the disclosure. Referring to FIG. 1A to FIG. 1D, the method of operating the sensor device of the embodiment is at least adapted to the sensor device 100 of FIG. 1A and FIG. 1B, but the disclosure is not limited thereto.

Taking the sensor device 100 of FIG. 1A and FIG. 1B for example, in step S100, sequentially scanning the scan lines S_(n−1) to S_(n+1) to turn on (enable) current sources to be detected on the scan lines S_(n−1) to S_(n+1). In step S110, a reference scan line S_ref is simultaneously scanned (selected) to turn on (enable) the plurality of current sinks on the reference scan line S_ref when one of the scan lines S_(n−1) to S_(n+1) is scanned in step S100. In another embodiment, presented in pixel point of view, taking the sensor device 100 of FIG. 1A and FIG. 1B for example, in step S100, the scan lines S_(n−1) to S_(n+1) are sequentially scanned (selected) to turn on (enable) current sources of the sensor pixels 112 of (m, n−1) to (m+1, n+1) to be detected on the scan lines S_(n−1) to S_(n+1). In step S110, a reference scan line S_ref is simultaneously scanned (selected) to turn on (enable) the plurality of reference pixels 114 on the reference scan line S_ref when one of the scan lines S_(n−1) to S_(n+1) is scanned in step S100. For example, the scan line S_(n−1) and the reference scan line S_ref are simultaneously selected and scanned during a sensing period T1, and the scan line S_(n) and the reference scan line S_ref are simultaneously selected and scanned during a next sensing period Ti. Other scan lines are sequentially scanned and the reference scan line S_ref is simultaneously selected during the respective sensing period T1.

In step S120, the charge integrators 122 respectively receive for summarizing a sensing currents Is from the data lines D_(m) and D_(m+1) and convert the sensing currents Is into sensing voltages (output voltages) Vout(m) and Vout(m+1) for each of the data lines D_(m) and D_(m+1) and then output, where the sensing voltage Vout(m+1) is not shown in FIG. 1B. In addition, sufficient teaching, suggestion, and implementation illustration regarding the method of operating the sensor device of the embodiments of the disclosure may be obtained from the foregoing embodiments of FIG. 1A to FIG. 1C, and thus related description thereof is not repeated hereinafter.

Figure 2A:
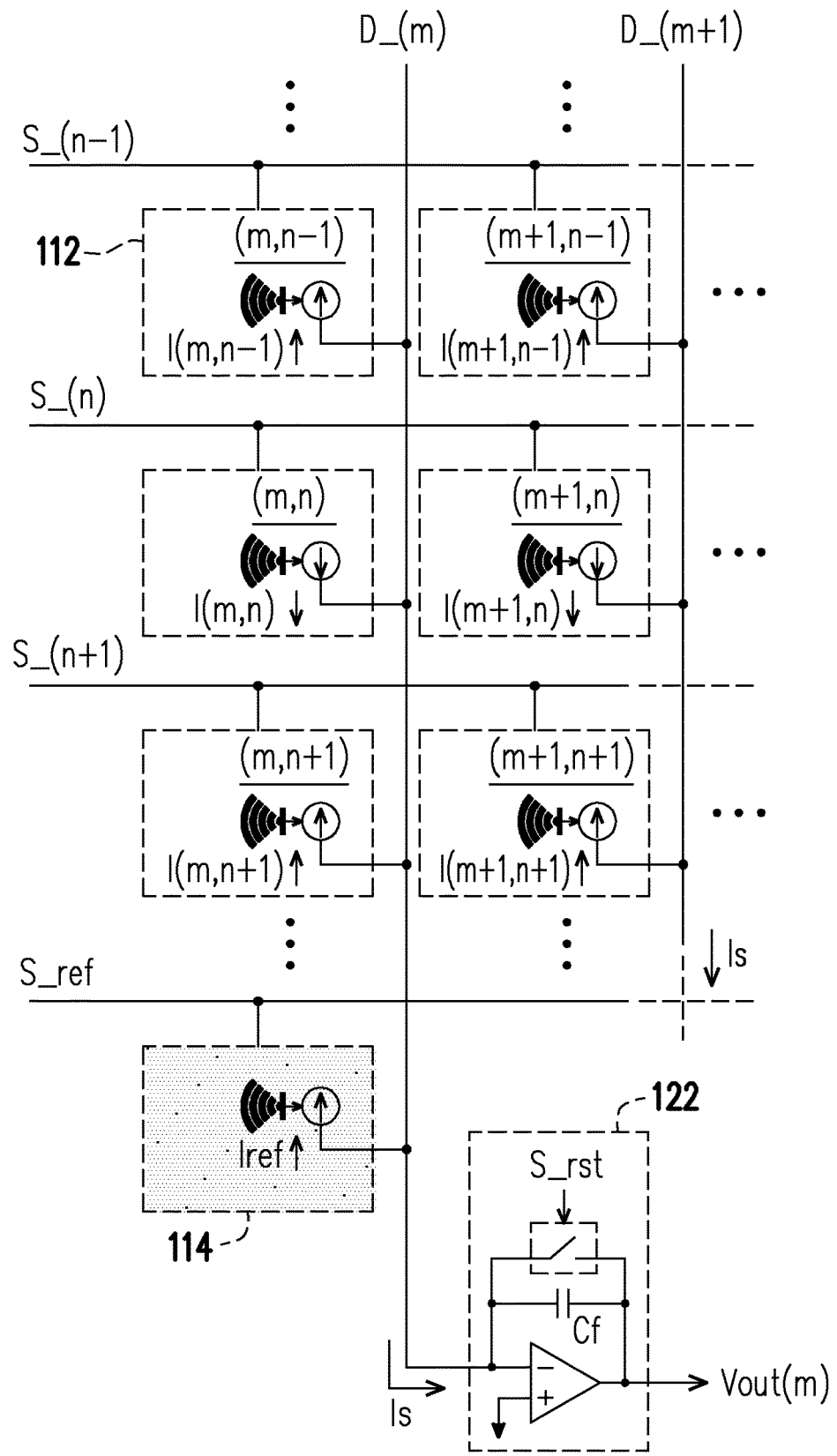
FIG. 2A illustrates a schematic diagram of a sensor array and a charge integrator according to another embodiment of the disclosure.
Figure 2B:
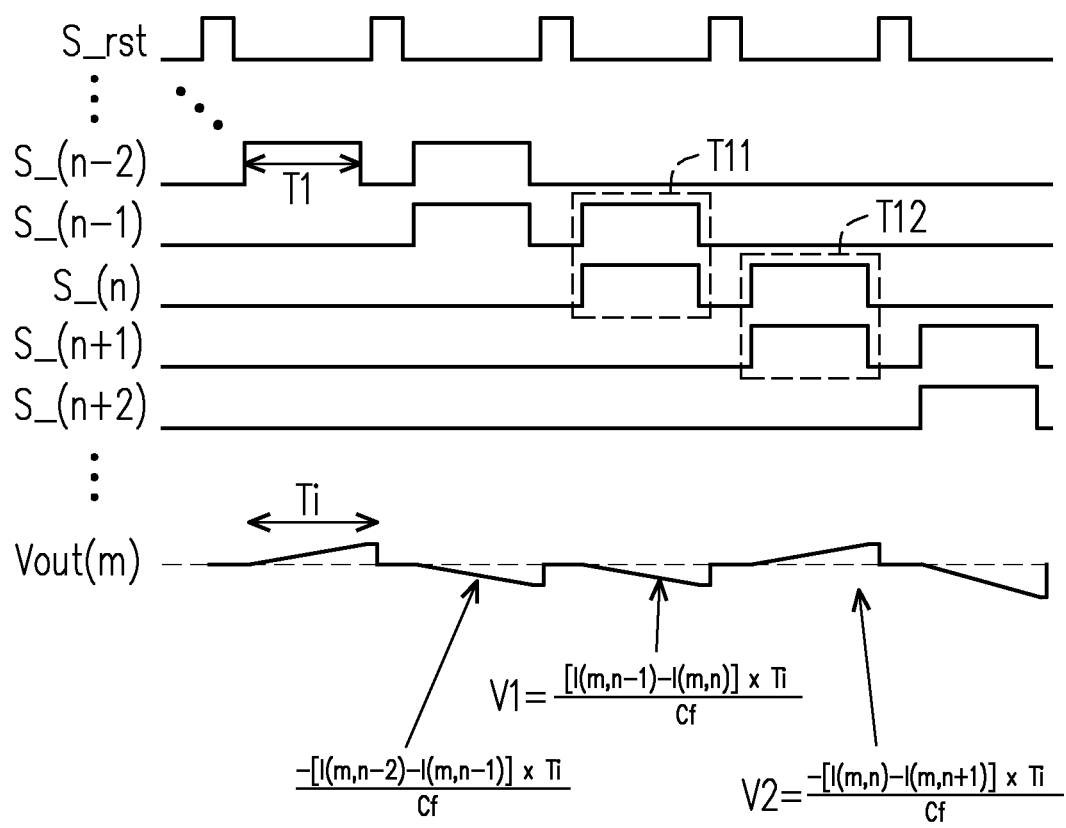
FIG. 2B illustrates a waveform diagram of signals depicted in FIG. 2A.

FIG. 2A illustrates a schematic diagram of a sensor array and a charge integrator according to another embodiment of the disclosure. FIG. 2B illustrates a waveform diagram of signals depicted in FIG. 2A. Referring to FIG. 2A and FIG. 2B, in an embodiment, the current sources of (m, n) and (m+1, n) on the scan line S_(n) and are respectively configured to output pixel currents I(m, n) and I(m+1, n) to the corresponding charge integrators 122 through Data line D_(m) or D_(m+1). The current sinks of (m, n−1) and (m+1, n−1) corresponding to the scan line S_(n−1) and the current sinks of (m, n+1) and (m+1, n+1) corresponding to the scan line S_(n+1) are respectively configured to drain current I(m, n−1), I(m+1, n−1), (m, n+1) and (m+1, n+1) from the corresponding charge integrators 122. The current sink on the scan line S_ref is respectively configured to drain current Iref from the corresponding charge integrators 122. In an embodiment, for the current sinks of (m, n−1) and (m, n+1), current source (m, n), and the current sink corresponding to scan line S_ref are connected the same data line D_(m), the current source of (m, n) may serves for sensing (sensor) or reference. Along an extending direction of the data line D_(m), the current source of (m, n) is located between the two current sinks of (m, n−1) and (m, n+1). In an embodiment, current sources and current sinks are alternately arranged (staggered or interlaced) for compensating to each other. In other embodiments, current source may be corresponding to scan line S_ref. Referring to FIG. 2A and FIG. 2B again, in another embodiment, presented in pixel point of view, there are two types of sensor pixels 112 in the sensor array, and each of the sensor pixels 112 has an identical sensor. The sensor pixels 112 of (m, n) and (m+1, n) on the scan line S_(n) have current sources and are respectively configured to output pixel currents I(m, n) and I(m+1, n) to the corresponding charge integrators 122 through Data line D_(m) or D_(m+1). The sensor pixels 112 of (m, n−1) and (m+1, n−1) corresponding to the scan line S_(n−1) and the sensor pixels 112 of (m, n+1) and (m+1, n+1) corresponding to the scan line S_(n+1) have current sinks and are respectively configured to drain current I(m, n−1), I(m+1, n−1), (m, n+1) and (m+1, n+1) from the corresponding charge integrators 122. The reference pixel 114 on the scan line S_ref has current sink and is respectively configured to drain current Iref from the corresponding charge integrators 122. In an embodiment, for the sensor pixels 112 of (m, n−1), (m, n) and (m, n+1) and the reference pixel 114 connected the same data line D_(m), the sensor pixel 112 of (m, n) may serve as a reference sensor pixel or sensing sensor pixel. Along an extending direction of the data line D_(m), the sensor pixel 112 of (m, n) is located between the two sensor pixels the sensor pixels 112 of (m, n−1) and (m, n+1). In an embodiments, the sensor pixels 112 having current sources as sensing pixels and the sensor pixels 112 having current sinks as reference pixels are alternately arranged (staggered or interlaced) for compensating to each other, and the reference pixel 114 also includes a current sink. In other embodiments, the sensor pixels 112 may has current source or current sink, and the reference pixel 114 may include a current source.

Referring to FIG. 2B, during each sensing period, two neighboring scan lines of the scan lines S_(n−1) to S_(n+1) are selected. Taking the data line D_(m) for example, the current sink of (m, n−1) or the sensor pixels 112 of (m, n−1) having current sink corresponding to the scan line S_(n−1) is selected and the current source of (m, n) or the sensor pixels 112 of (m, n) having the current source corresponding to the scan line S_(n) during the sensing period T11. Current from sensor pixels 112 of (m, n−1) and current from sensor pixels 112 of (m, n) is transmitted from data line D_(m) to the charge integrator 122 for summarizing a sensing current Is. The sensing current Is is a summation of the pixel currents I(m, n−1) and I(m, n), i.e. Is=−I(m, n−1)+I(m, n), where "−I(m, n−1)" indicates the current I(m, n−1) drained from the charge integrator 122. Next, the charge integrator 122 converts the sensing current Is into the output voltage Vout(m) during the integration time T1 and then output. The output voltage Vout(m) is equal to V1 as denoted in FIG. 2B, V1 is −[−I(m, n−1)+I(m, n)]×Ti/Cf=[I(m, n−1)−I(m, n)]×Ti/Cf. Similarly, the sensor pixels 112 of (m, n) on the scan line S_(n) is selected for current source and the sensor pixels 112 of (m, n+1) on the scan line S_(n+1) for current sink during the next sensing period T12. The sensing current Is is a summation of the pixel currents I(m, n) and I(m, n+1), i.e. Is=I(m, n)+[−I(m, n+1)], where "−I(m, n+1)" indicates the pixel current I(m, n) drained from the charge integrator 122. Next, the charge integrator 122 converts the sensing current Is into the output voltage Vout(m) during the integration time Ti. The output voltage Vout(m) is equal to V2 as denoted in FIG. 2B. V2 is −[I(m, n)−I(m, n+1)]×Ti/Cf. For the current sink of (m, n+1) or sensor pixel 112 of (m, n+1) having current sink on the scan line S_(n+1), the output voltage Vout(m) can be deduced by analogy. For the data lines D_(m+1), the output voltage Vout(m+1) (not shown) of the current sinks of (m+1, n−1), (m+1, n) and (m+1, n+1) or the sensor pixels 112 of (m+1, n−1), (m+1, n) and (m+1, n+1) having current sinks respectively on the scan lines S_(n−1), S_(n) and S_(n+1) can be deduced by analogy.

As shown in FIG. 2B, the sensor device 100 operates in a row-by-row differential read-out scheme with two scan lines by sequentially selecting current sources, current sinks, or sensor pixels 112 having current sources or current sinks to be detected on two neighboring scan lines. In an embodiment, since the two neighboring scan lines are selected to be detected, process variation and background noise are cancelled by subtraction, and then sensed physical value, e.g. photocurrent of photodiode, is reported.

Figure 2C:
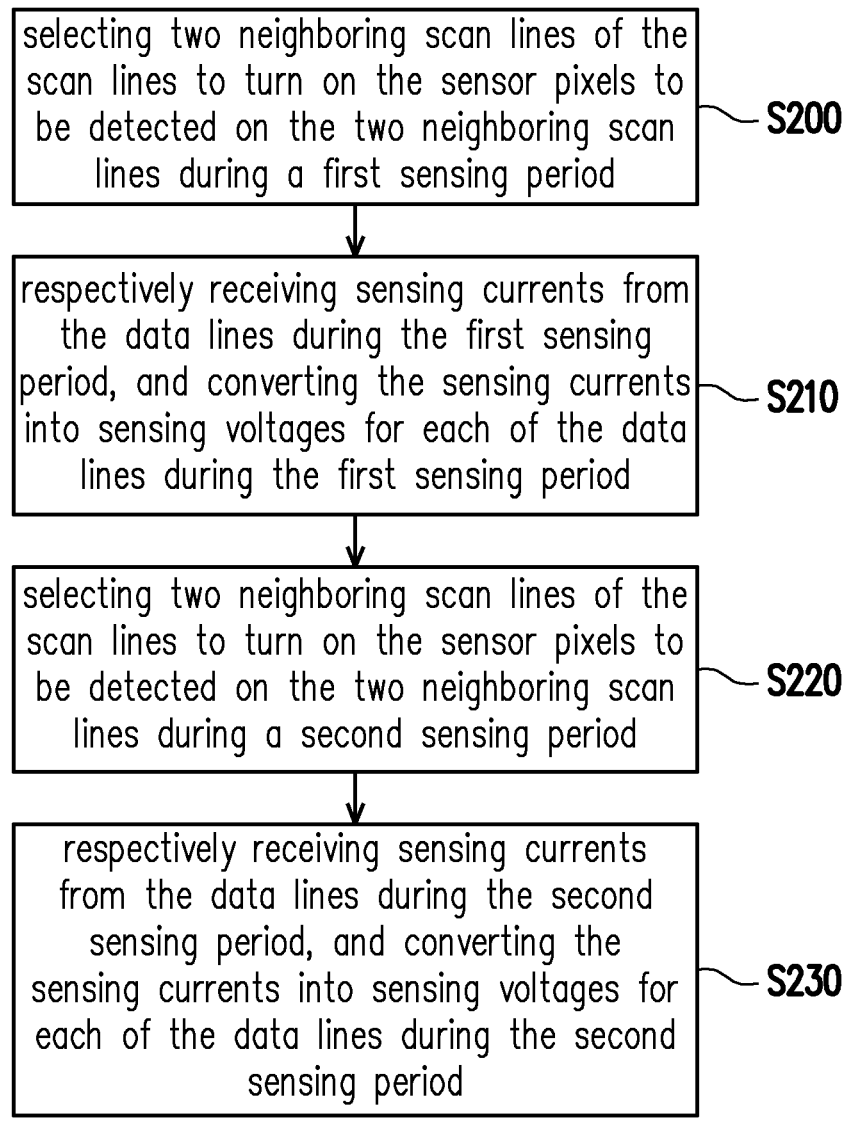
FIG. 2C is a flowchart illustrating steps in a method of operating a sensor device according to another embodiment of the disclosure.

FIG. 2C is a flowchart illustrating steps in a method of operating a sensor device according to another embodiment of the disclosure. Referring to FIG. 2A to FIG. 2C, the method of operating the sensor device of the embodiment is at least adapted to the sensor device 100 of FIG. 1A and FIG. 2A, but the disclosure is not limited thereto.

Taking the sensor device 100 of FIG. 1A and FIG. 2A for example, in step S200, two neighboring scan lines S_(n−1) and S(n) are selected and scanned to turn on the current sinks of (m, n−1) and (m+1, n−1) and current sources of (m, n) and (m+1, n) to be detected during a first sensing period T11. In step S210, the charge integrators 122 respectively receive sensing currents Is from the data lines D_(m) and D(m+1) during the first sensing period T11, and convert the sensing currents Is into sensing voltages Vout(m) and Vout(m+1) for each of the data lines D_(m) and D(m+1) during the first sensing period T11, where the sensing voltage Vout(m+1) is not shown in FIG. 2A. In step S220, two neighboring scan lines S_(n) and S(n+1) are selected and scanned to turn on the current sources of (m, n) and (m+1, n) and current sinks of (m, n+1) and (m+1, n+1) to be detected during a second sensing period T12. In another embodiment, presented in pixel point of view, taking the sensor device 100 of FIG. 1A and FIG. 2A for example, in step S200, two neighboring scan lines S_(n−1) and S(n) are selected and scanned to turn on the sensor pixels 112 of (m, n−1) to (m+1, n) to be detected during a first sensing period T11. In step S210, the charge integrators 122 respectively receive sensing currents Is from the data lines D_(m) and D(m+1) during the first sensing period T11, and convert the sensing currents Is into sensing voltages Vout(m) and Vout(m+1) for each of the data lines D_(m) and D(m+1) during the first sensing period T11, where the sensing voltage Vout(m+1) is not shown in FIG. 2A. In step S220, two neighboring scan lines S_(n) and S(n+1) are selected and scanned to turn on the sensor pixels 112 of (m, n) to (m+1, n+1) to be detected during a second sensing period T12. In step S230, the charge integrators 122 respectively receive sensing currents Is from the data lines D_(m) and D(m+1) during the second sensing period T12, and convert the sensing currents Is into voltages Vout(m) and Vout(m+1) for of the data lines D_(m) and D(m+1) during the second sensing period T12. In steps S200 and S220, the same scan lines S_(n) is selected and scanned during the first sensing period and the second sensing period. That is, one of the two neighboring scan lines S_(n−1) and S_(n) selected during the first sensing period T11 is the same as one of the two neighboring scan lines S_(n) and S(n+1) selected during the second sensing period T12 in an embodiment.

In addition, sufficient teaching, suggestion, and implementation illustration regarding the method of operating the sensor device of the embodiments of the disclosure may be obtained from the foregoing embodiments of FIG. 2A to FIG. 2B, and thus related description thereof is not repeated hereinafter.

Besides the above one pair of two types, N pairs are available, where N is a natural number. Taking the data line D_(m) for example, a total sensing current from the data line D_(m) may be calculated based on a plurality of output of steps. The steps include step 0 to step N−1. In step 0, the sensing current is Is_(0)=I(m, 0)−I(m, 1), wherein I(m, 0) is an initial pixel current; in step 1, the sensing current is Is_(1)=−I(m, 1)+I(m, 2); . . . ; and in step N−1, the sensing current is Is_(N−1)=−I(m, n−1)+I(m, n). Then, a summation of the sensing currents, i.e. the output of the steps, can be Is_(0)−Is_(1)+Is_(2) . . . . That is, the total sensing current is equal to I(m, 0)−I(m, n). If the sensing current I(m, 0) is known, the sensing current I(m, n) can be obtained. The charge integrator 122 converts the sensing current I(m, n) into the output voltage Vout(m) and output. In an embodiment, the reference current Iref of the current sink corresponding to scan line S_ref or reference pixel 114 may serve as the initial sensing current I(m, 0).

Figure 3:
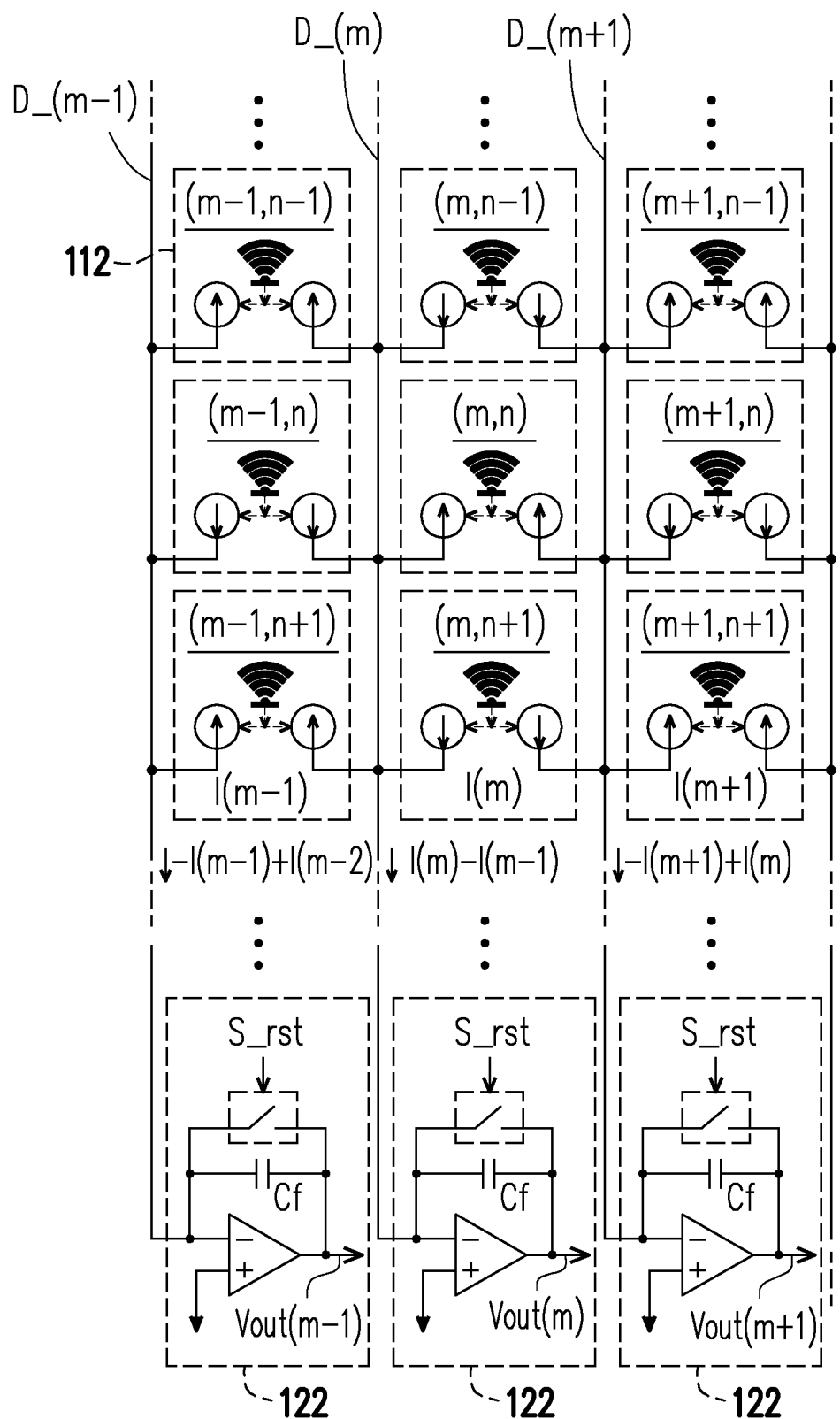
FIG. 3 illustrates a schematic diagram of a sensor array and a charge integrator according to another embodiment of the disclosure.

FIG. 3 illustrates a schematic diagram of a sensor array and a charge integrator according to another embodiment of the disclosure. Referring to FIG. 3, two current sources are combined into a first group, two current sinks are combined into a second group. In an embodiment, at least one current source of the first group and at least one current sink of the second group may be connected to one data line and may be corresponding to one scan line, e.g., scan line S_(n−1), S_(n), and S_(n+1), scan line S_ref. In presented pixel point of view, the sensor pixels 112 of an embodiment include dual current sources or dual current sinks. For scan line S_(n−1) or scan line S_(n+1), the charge integrators 122 of the data lines D_(m−1), D_(m) and D_(m+1) respectively convert the sensing current [−I(m−1)+I(m−2)], [I(m)−I(m−1)] and [−I(m+1)+I(m)] into the output voltage Vout(m−1), Vout(m) and Vout(m+1). For scan line S_(n), the charge integrators 122 of the data lines D_(m−1), D_(m) and D_(m+1) respectively convert the sensing current [I(m−1)−I(m−2)], [−I(m)+I(m−1)] and [I(m+1)−I(m)] into the output voltage Vout(m−1), Vout(m) and Vout(m+1).

Figure 4:
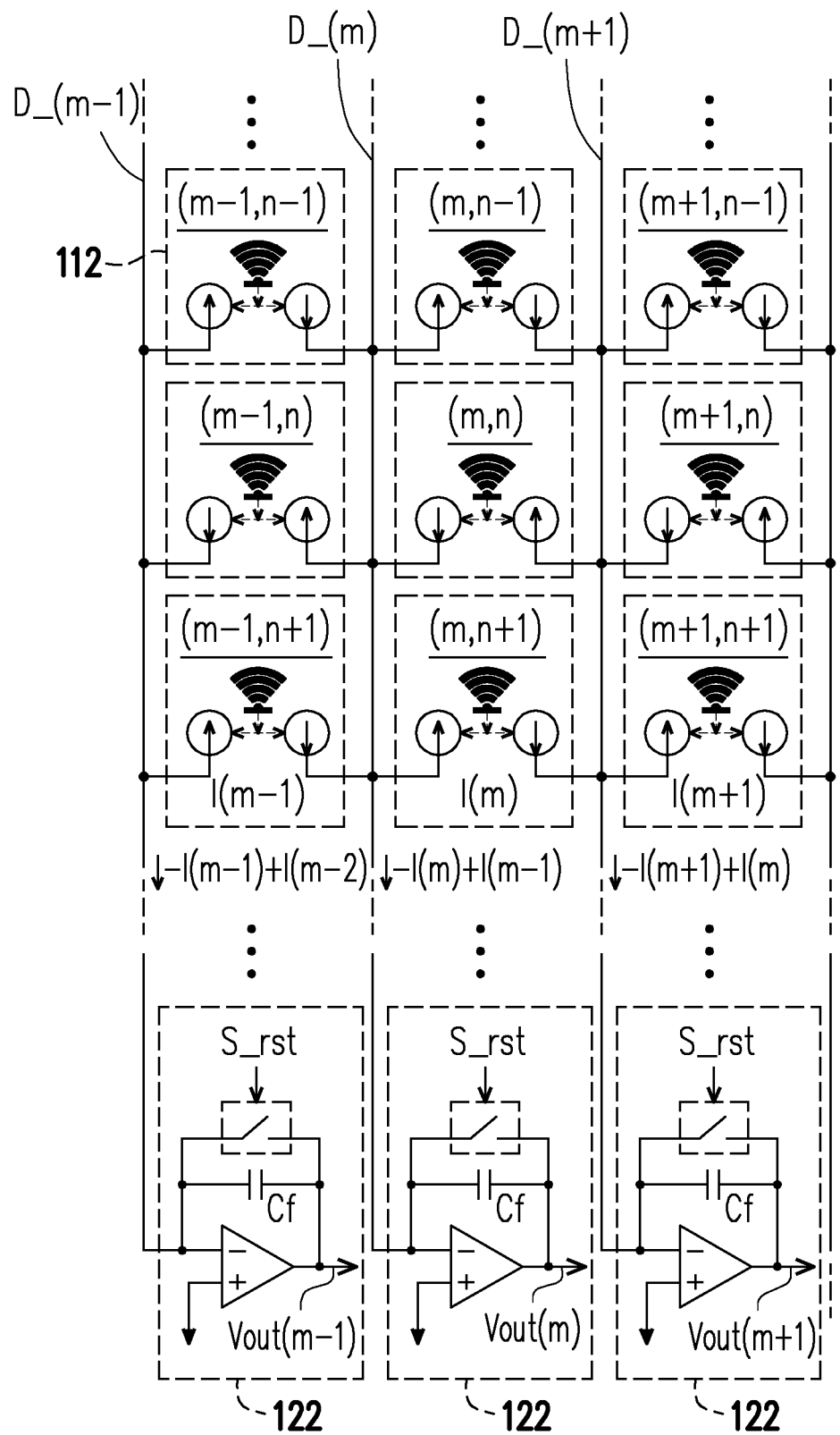
FIG. 4 illustrates a schematic diagram of a sensor array and a charge integrator according to another embodiment of the disclosure.

FIG. 4 illustrates a schematic diagram of a sensor array and a charge integrator according to another embodiment of the disclosure. In an embodiment, one current source and one current sink are combined into a first group, another current source and another current sink are combined in a second group. Referring to FIG. 4 again, in another embodiment, presented pixel point of view, each of the sensor pixels 112 of an embodiment includes a current source and a current sink. For scan line S_(n), the charge integrators 122 of the data lines D_(m−1), D_(m) and D_(m+1) respectively convert the sensing current [−I(m−1)+I(m−2)], [I(m)−I(m−1)] and [−I(m+1)+I(m)] into the output voltage Vout(m−1), Vout(m) and Vout(m+1). For scan line S_(n−1) or scan line S_(n+1), the charge integrators 122 of the data lines D_(m−1), D_(m) and D_(m+1) respectively convert the sensing current [I(m−1)−I(m−2)], [−I(m)+I(m−1)] and [I(m+1)−I(m)] into the output voltage Vout(m−1), Vout(m) and Vout(m+1).

The method for operating the sensor device described in the embodiments illustrated in FIG. 3 and FIG. 4 is sufficiently taught, suggested, and embodied in the embodiments illustrated in FIG. 1A to FIG. 2C, and therefore no further description is provided herein.

In the embodiments of the disclosure, the sensor device 100 may be applied to optical sensing, X-ray sensing, pressure sensing, thermal sensing, capacitive sensing, and so on. As examples, the following embodiments will show the above-mentioned application with a specific sensor and current driver circuit, but the disclosure is not limited thereto.

Figure 5A:
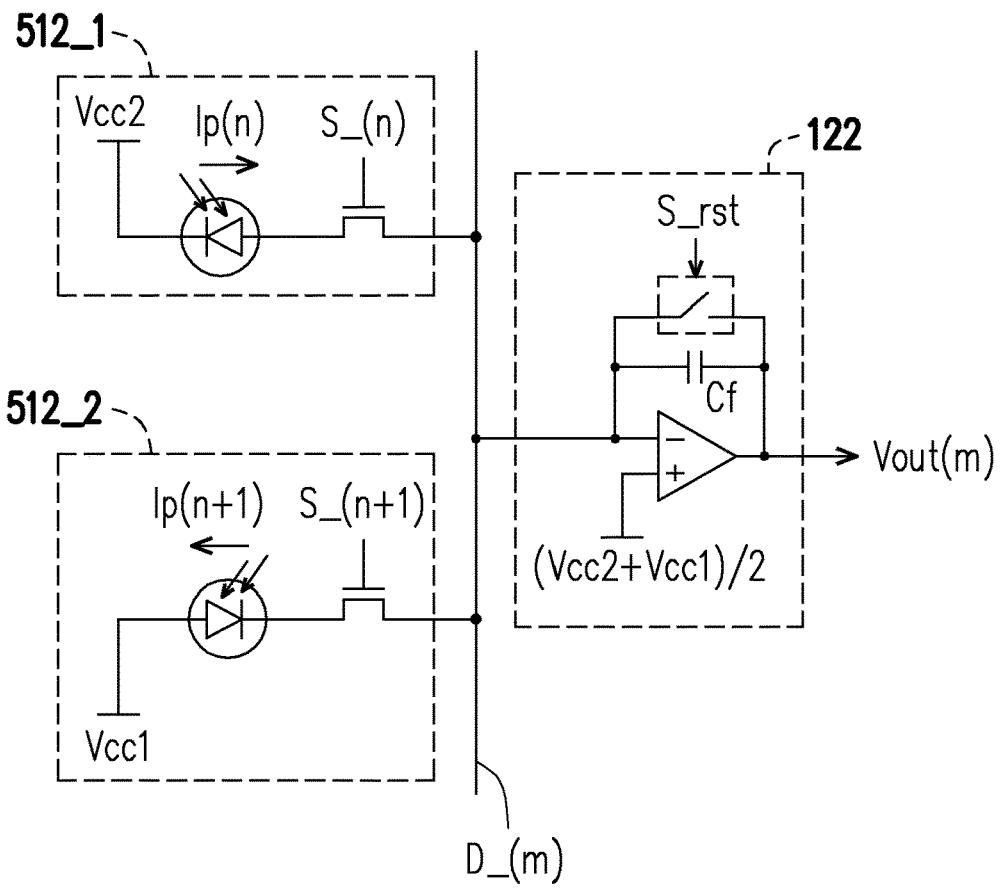
FIG. 5A illustrates a schematic diagram of a sensor array and a charge integrator according to another embodiment of the disclosure.
Figure 5B:
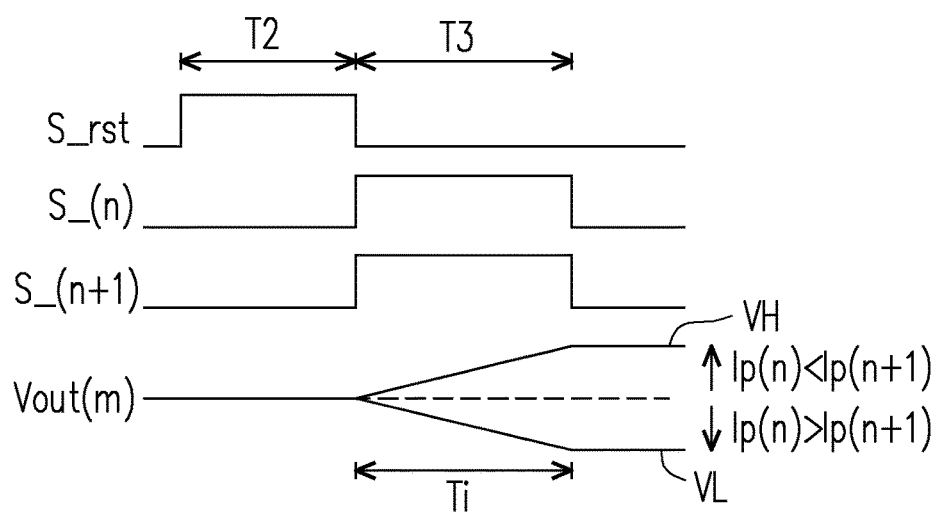
FIG. 5B illustrates a waveform diagram of signals depicted in FIG. 5A.

FIG. 5A illustrates a schematic diagram of a sensor array and a charge integrator according to another embodiment of the disclosure. FIG. 5B illustrates a waveform diagram of signals depicted in FIG. 5A. Referring to FIG. 5A and FIG. 5B, the sensor pixels 512_1 and 512_2 are passive pixels with photodiodes. The sensor device 100 may be configured for optical sensing in an embodiment. The sensor pixels 512_1 and 512_2 respectively include a current source and a current sink. The voltage Vcc1 is a negative voltage and the voltage Vcc2 is a positive voltage, and the voltage Vcc2 is higher than the voltage Vcc1. The absolute value of the voltage Vcc1 is equal to that of the voltage Vcc2. The period T2 is a reset period. The period T3 is an exposure and readout period. The output voltage Vout(m) can be calculated based on the formula: Vout(m)=−[Ip(n)−Ip(n+1)]×Ti/Cf. The output voltage Vout(m) is a function of photocurrent difference. If absolute value of the sensing current Ip(n) is smaller than absolute value of the sensing current Ip(n+1), the output voltage Vout(m) reaches to a high voltage VH. If absolute value of the sensing current Ip(n) is larger than absolute value of the sensing current Ip(n+1), the output voltage Vout(m) reaches to a low voltage VL.

Figure 6A:
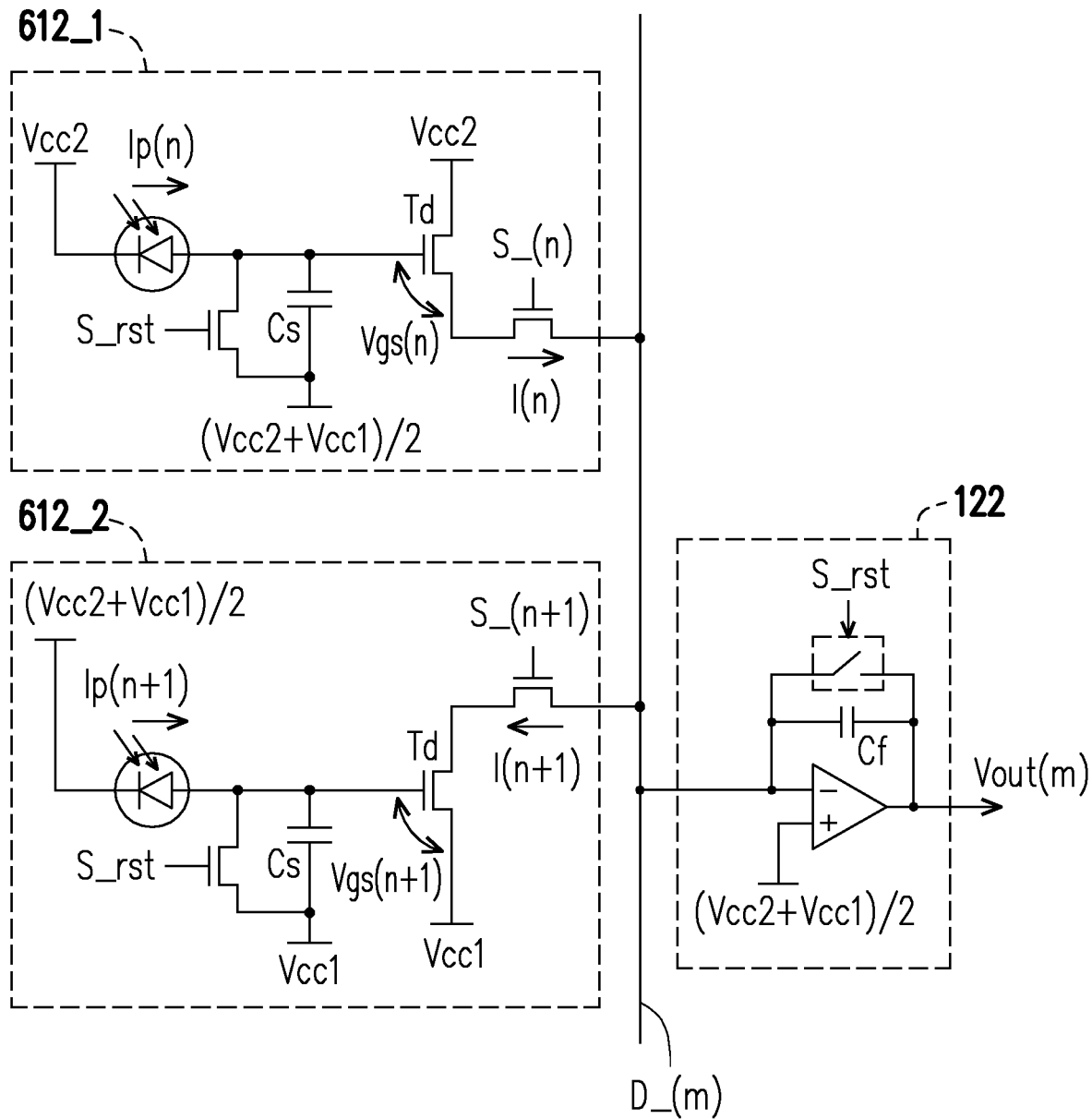
FIG. 6A illustrates a schematic diagram of a sensor array and a charge integrator according to another embodiment of the disclosure.
Figure 6B:
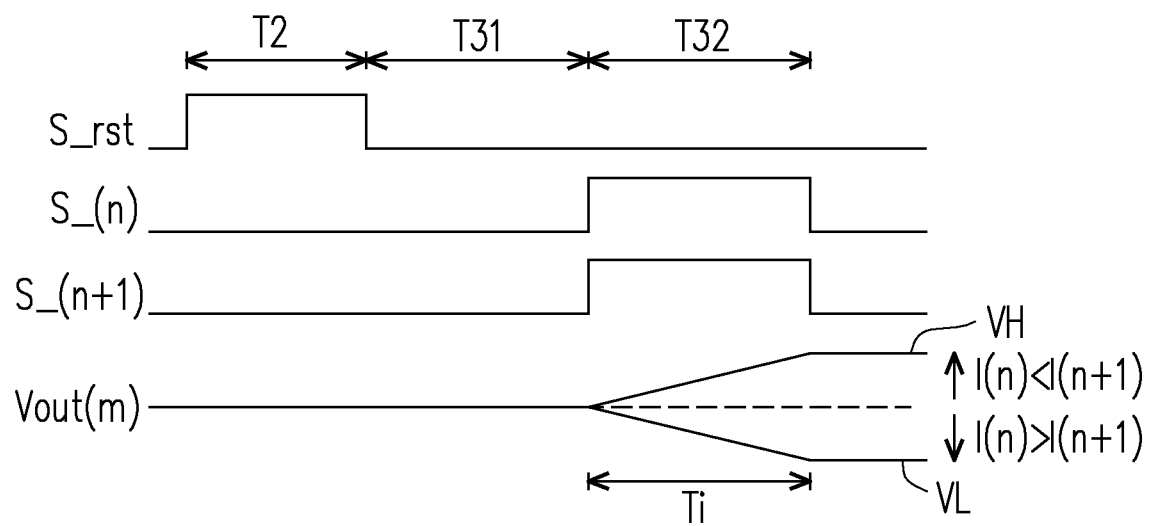
FIG. 6B illustrates a waveform diagram of signals depicted in FIG. 6A.

FIG. 6A illustrates a schematic diagram of a sensor array and a charge integrator according to another embodiment of the disclosure. FIG. 6B illustrates a waveform diagram of signals depicted in FIG. 6A. Referring to FIG. 6A and FIG. 6B, the sensor pixels 612_1 and 612_2 are active pixels with photodiodes, e.g. a photodiode and a photo-sensitive double gate thin-film transistor (DGTFT). The sensor pixels 612_1 and 612_2 respectively include a photodiode sensor. The sensor device 100 may be configured for optical sensing in an embodiment. The sensor pixels 612_1 and 612_2 respectively include a current source and a current sink. The period T2 is a reset period. The period T31 is an exposure period, and the period T32 is a readout period. The output voltage Vout(m) can be calculated based on the formula: Vout(m)=−[I(n)−I(n+1)]×Ti/Cf. The output voltage Vout(m) is a function of photocurrent difference. If absolute value of the sensing current I(n) is smaller than absolute value of the sensing current I(n+1), the output voltage Vout(m) reaches to a high voltage VH. If absolute value of the sensing current I(n) is larger than absolute value of the sensing current I(n+1), the output voltage Vout(m) reaches to a low voltage VL.

Figure 7A:
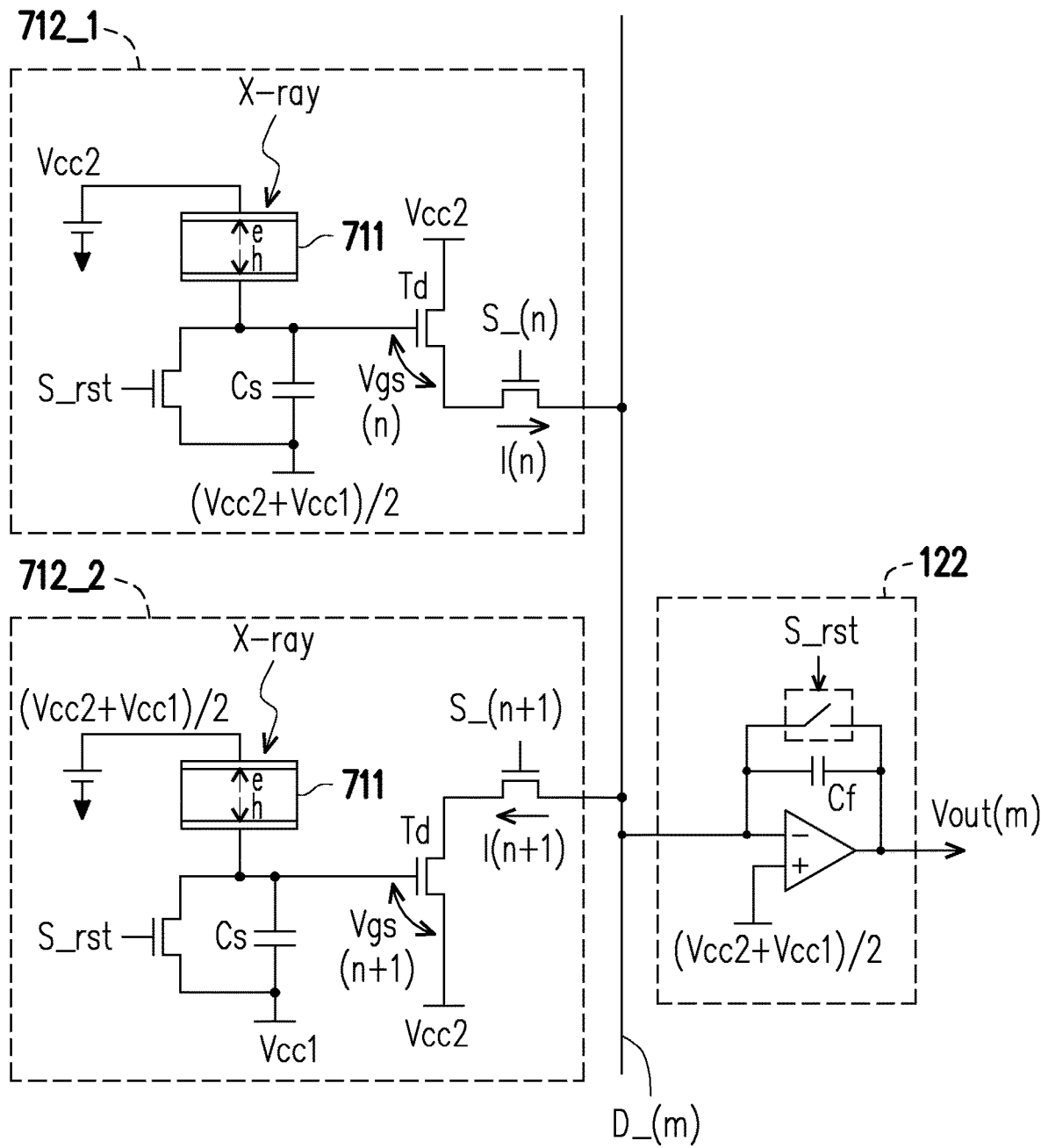
FIG. 7A illustrates a schematic diagram of a sensor array and a charge integrator according to another embodiment of the disclosure.
Figure 7B:
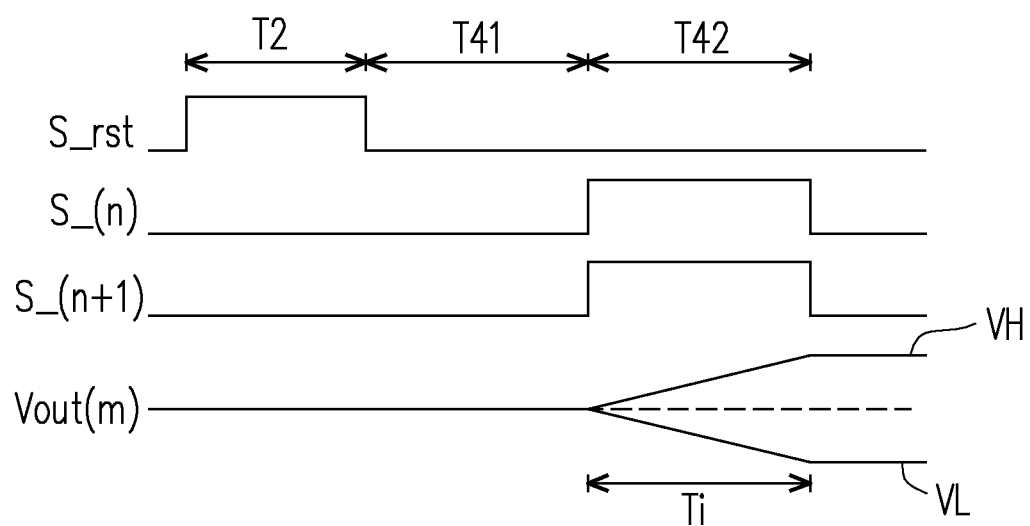
FIG. 7B illustrates a waveform diagram of signals depicted in FIG. 7A.

FIG. 7A illustrates a schematic diagram of a sensor array and a charge integrator according to another embodiment of the disclosure. FIG. 7B illustrates a waveform diagram of signals depicted in FIG. 7A. Referring to FIG. 7A and FIG. 7B, the sensor device 100 may be configured for X-ray sensing in an embodiment. The sensor pixels 712_1 and 712_2 are active pixels with direct-conversion type. The sensor pixels 712_1 and 712_2 respectively include an X-ray sensor. In another embodiment, the sensor pixels 712_1 and 712_2 may be passive pixels with direct-conversion type. The sensor pixels 712_1 and 712_2 respectively include a current source and a current sink. The period T2 is a reset period. The period T41 is an irradiation period, and the period T42 is a readout period. The DC-biased photoconductors 711 generate hole or electron by receiving X-ray. Both the current source and sink pixels collect holes. The voltage of the capacitor Cs is charged up by collected holes and turns on the drive transistor Td. Accordingly, charge is converted into current. The output voltage Vout(m) is a function of current difference and shows X-ray intensity difference.

Figure 8A:
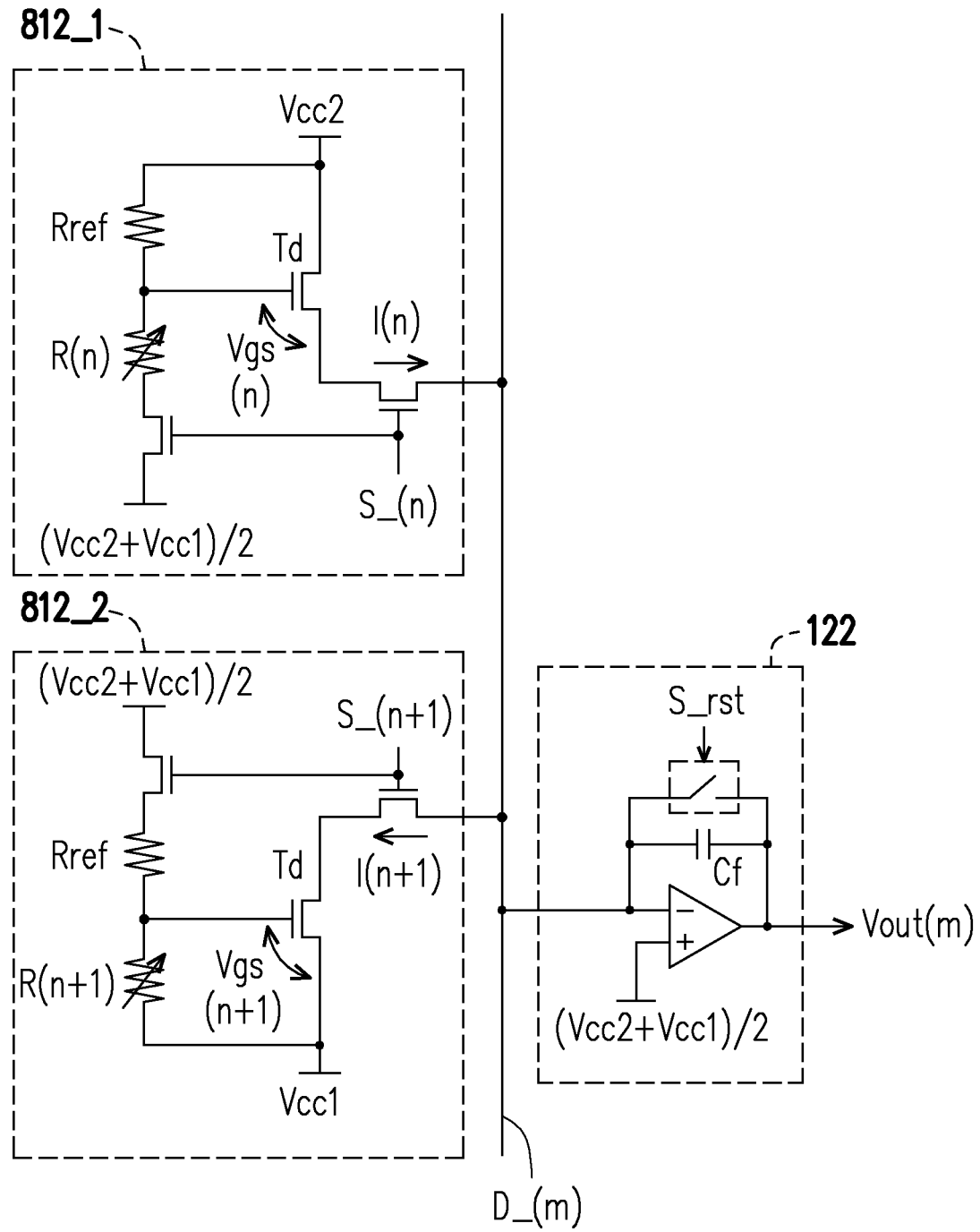
FIG. 8A illustrates a schematic diagram of a sensor array and a charge integrator according to another embodiment of the disclosure.
Figure 8B:
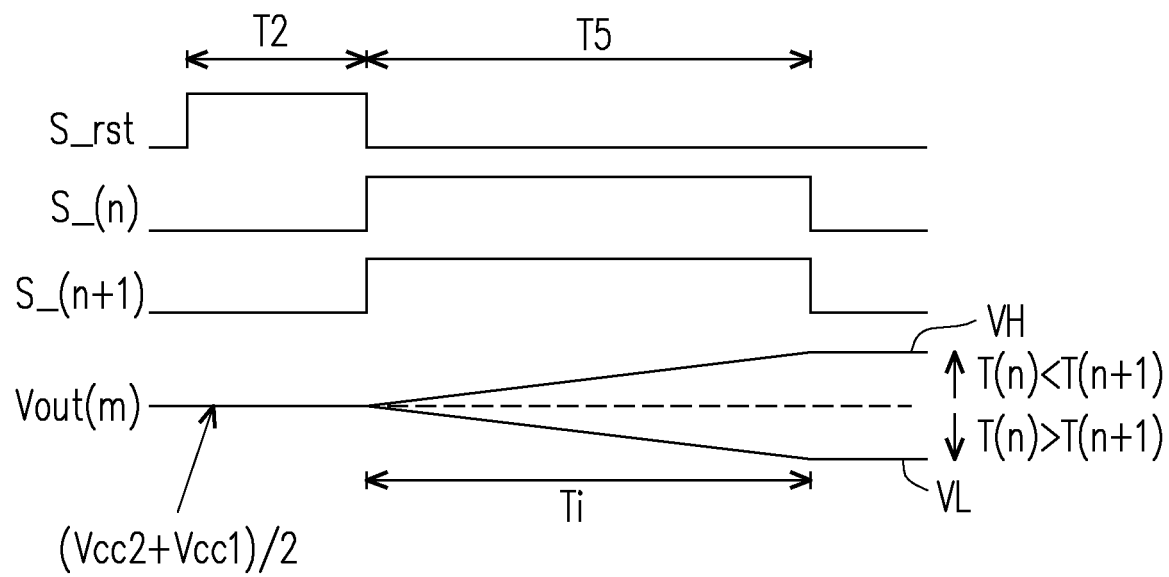
FIG. 8B illustrates a waveform diagram of signals depicted in FIG. 8A.

FIG. 8A illustrates a schematic diagram of a sensor array and a charge integrator according to another embodiment of the disclosure. FIG. 8B illustrates a waveform diagram of signals depicted in FIG. 8A. Referring to FIG. 8A and FIG. 8B, the sensor device 100 may be configured for thermal sensing in an embodiment. The sensor pixels 812_1 and 812_2 are active pixels. The sensor pixels 812_1 and 812_2 respectively include a thermal sensor. In another embodiment, the sensor pixels 812_1 and 812_2 may be passive pixels. The sensor pixels 812_1 and 812_2 respectively include a current source and a current sink. The period T2 is a reset period. The period T5 is a sensing and readout period. The resistive temperature detector (RTD) is equivalent to variable resistance R(n) and R(n+1), respectively as function of temperatures T(n) and T(n+1). A high temperature usually causes a high resistance. With fixed bias voltages, a reference resistance Rref and a drive transistor Td convert the resistance R(n) and R(n+1) to the current I(n) and I(n+1) respectively. The output voltage Vout(m) is a function of current difference and shows temperature difference. If temperature T(n) is lower than the temperature T(n+1), the output voltage Vout(m) reaches to a high voltage VH. If the temperature T(n) is higher than the temperature T(n+1), the output voltage Vout(m) reaches to a low voltage VL.

Figure 9A:
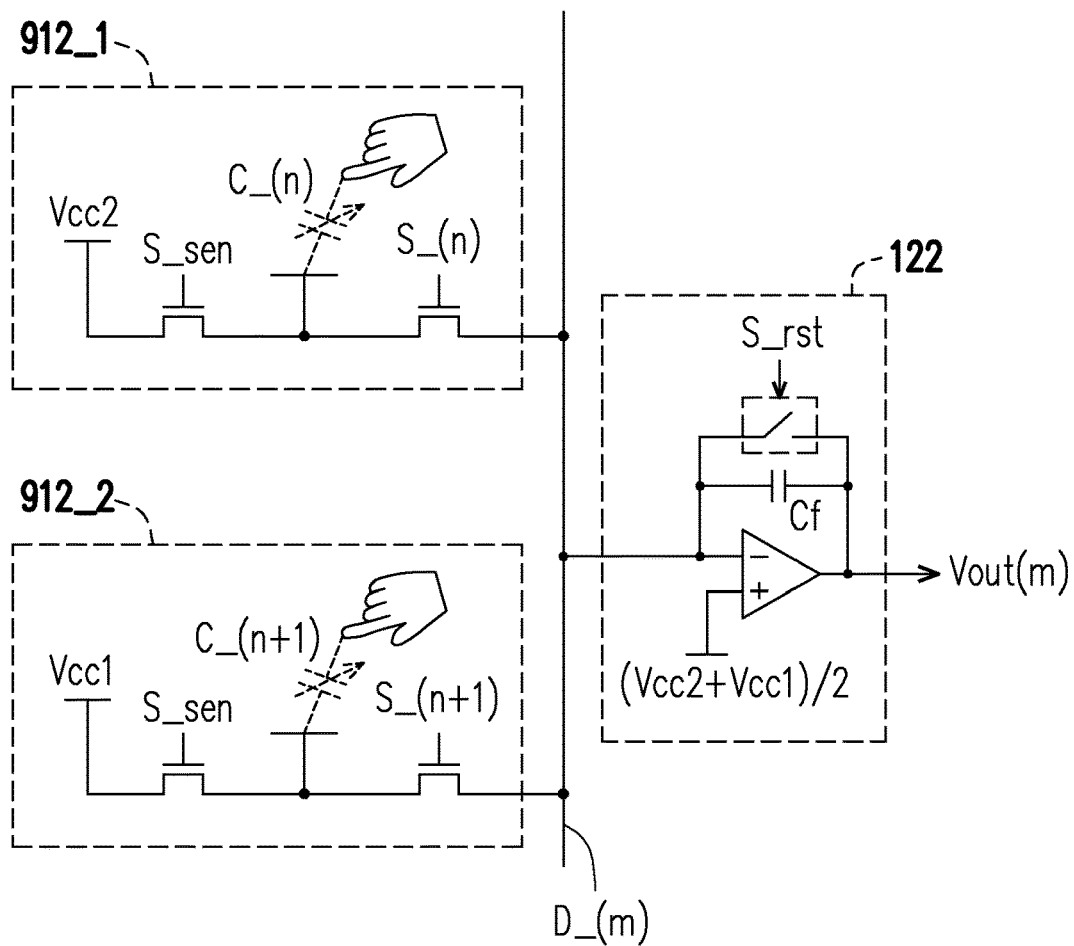
FIG. 9A illustrates a schematic diagram of a sensor array and a charge integrator according to another embodiment of the disclosure.
Figure 9B:
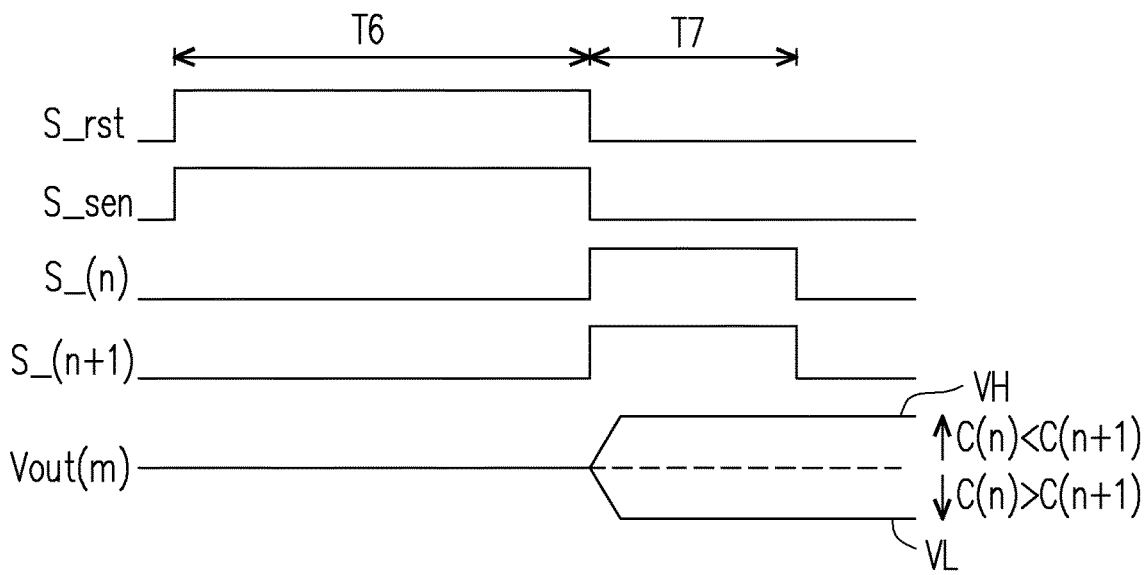
FIG. 9B illustrates a waveform diagram of signals depicted in FIG. 9A.

FIG. 9A illustrates a schematic diagram of a sensor array and a charge integrator according to another embodiment of the disclosure. FIG. 9B illustrates a waveform diagram of signals depicted in FIG. 9A. Referring to FIG. 9A and FIG. 9B, the sensor device 100 may be configured for capacitive sensing in an embodiment. The sensor pixels 912_1 and 912_2 are passive pixels with self-capacitance. The sensor pixels 912_1 and 912_2 respectively include a capacitive sensor. The sensor pixels 912_1 and 912_2 respectively include a current source and a current sink. The period T6 is a reset and sensing period. The period T7 is a readout period. With charge conservation formula "$C(n) \times (Vcc2-Vcc1)/2 + C(n+1) \times (Vcc1-Vcc2)/2 = Cf \times [(Vcc2+Vcc1)/2 - Vout(m)]$", the output voltage Vout(m) can be obtained. To simplify, the voltages Vcc2 and -Vcc1 can be set as a specific voltage Vin, and the output voltage Vout(m) is equal to $-Vin \times [C(n)-C(n+1)]/Cf$. The output voltage Vout(m) shows capacitance difference.

Figure 9C:
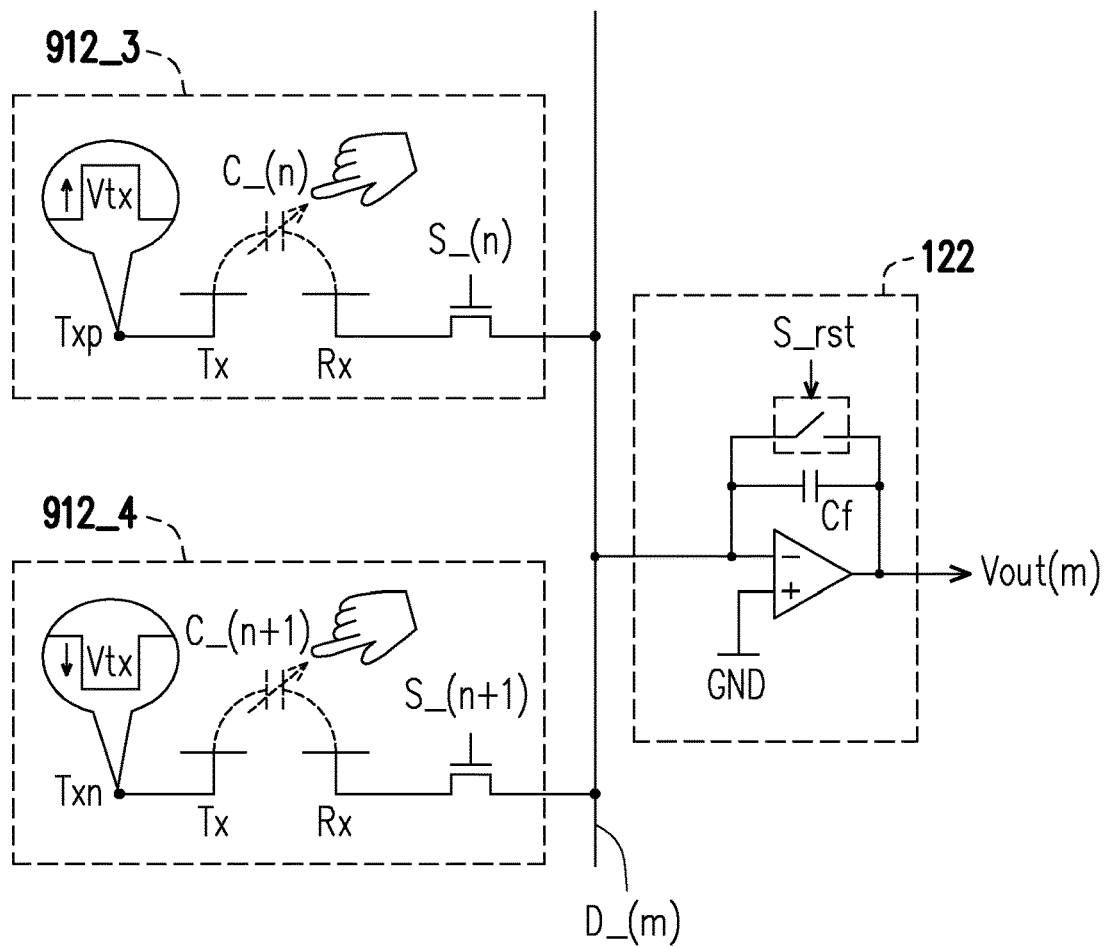
FIG. 9C illustrates a schematic diagram of a sensor array and a charge integrator according to another embodiment of the disclosure.
Figure 9D:
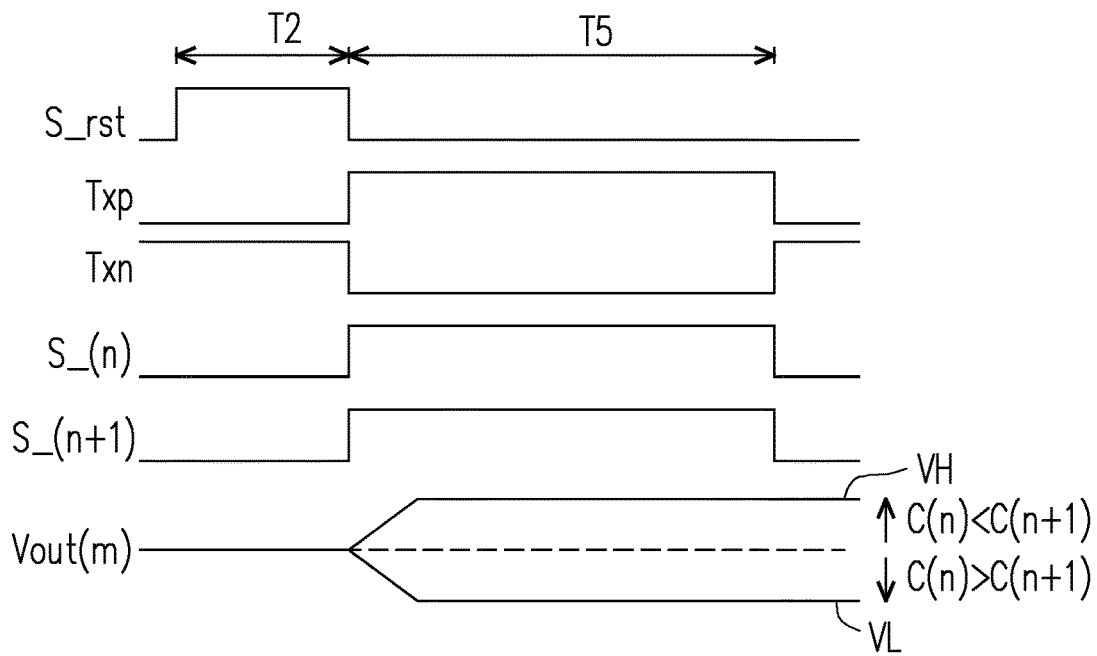
FIG. 9D illustrates a waveform diagram of signals depicted in FIG. 9C.

FIG. 9C illustrates a schematic diagram of a sensor array and a charge integrator according to another embodiment of the disclosure. FIG. 9D illustrates a waveform diagram of signals depicted in FIG. 9C. Referring to FIG. 9C and FIG. 9D, the sensor device 100 may be configured for capacitive sensing in an embodiment. The sensor pixels 912_3 and 912_4 are passive pixels with mutual-capacitance. The sensor pixels 912_3 and 912_4 respectively include a current source and a current sink. The period T2 is a reset period. The period T5 is a sensing and readout period. With charge conservation formula "$C(n) \times (Vtx) + C(n+1) \times (-Vtx) = Cf \times [-Vout(m)]$", the output voltage Vout(m) can be obtained. The output voltage Vout(m) is equal to $-Vtx \times [C(n)-C(n+1)]/Cf$. The output voltage Vout(m) shows capacitance difference.

Figure 10A:
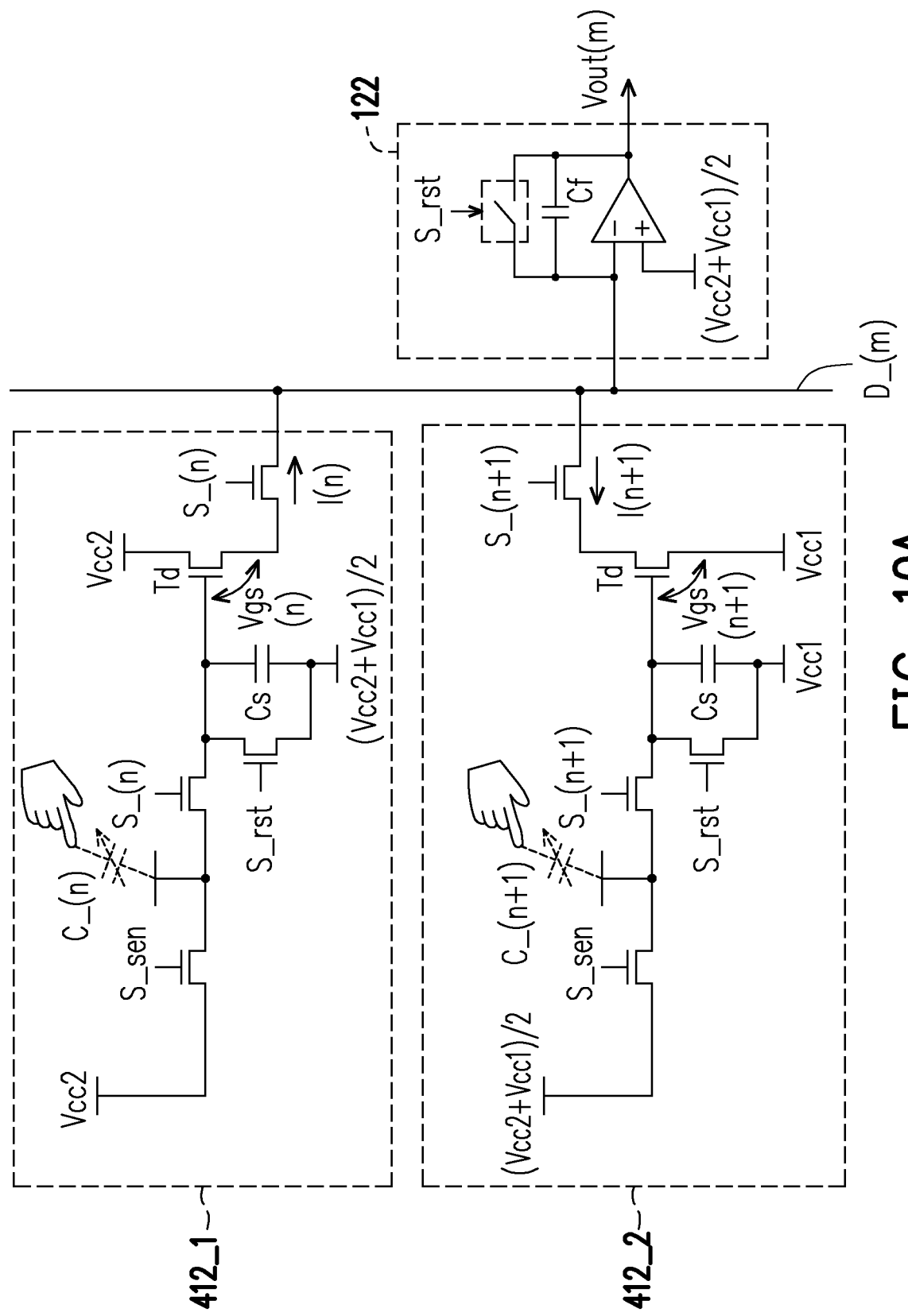
FIG. 10A illustrates a schematic diagram of a sensor array and a charge integrator according to another embodiment of the disclosure.
Figure 10B:
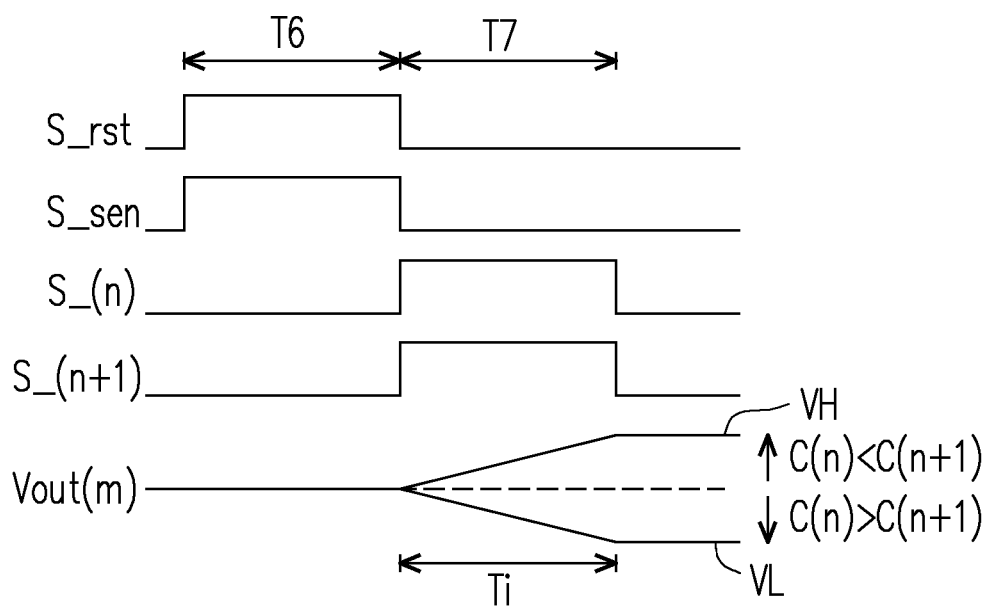
FIG. 10B illustrates a waveform diagram of signals depicted in FIG. 10A.

FIG. 10A illustrates a schematic diagram of a sensor array and a charge integrator according to another embodiment of the disclosure. FIG. 10B illustrates a waveform diagram of signals depicted in FIG. 10A. Referring to FIG. 10A and FIG. 10B, the sensor device 100 may be configured for capacitive sensing in an embodiment. The sensor pixels 412_1 and 412_2 are active pixels with self-capacitance. The sensor pixels 412_1 and 412_2 respectively include a current source and a current sink. The period T6 is a reset and sensing period. The period T7 is a readout period. To simplify, the voltages Vcc2 and -Vcc1 can be set as a specific voltage Vin. With charge conservation formula "$Vgs(n) = Vin \times C(n)/(C(n)+Cs)$; and $Vgs(n+1) = Vin \times C(n+1)/(C(n+1)+Cs)$", the output voltage Vout(m) can be obtained. With the drive transistor Td operates in a saturation region, I(n) and I(n+1) is function of Vgs(n) and Vgs(n+1), respectively, and the output voltage Vout(m) is equal to $-[I(n)-I(n+1)] \times Ti/Cf$. The output voltage Vout(m) shows capacitance difference.

Figure 11A:
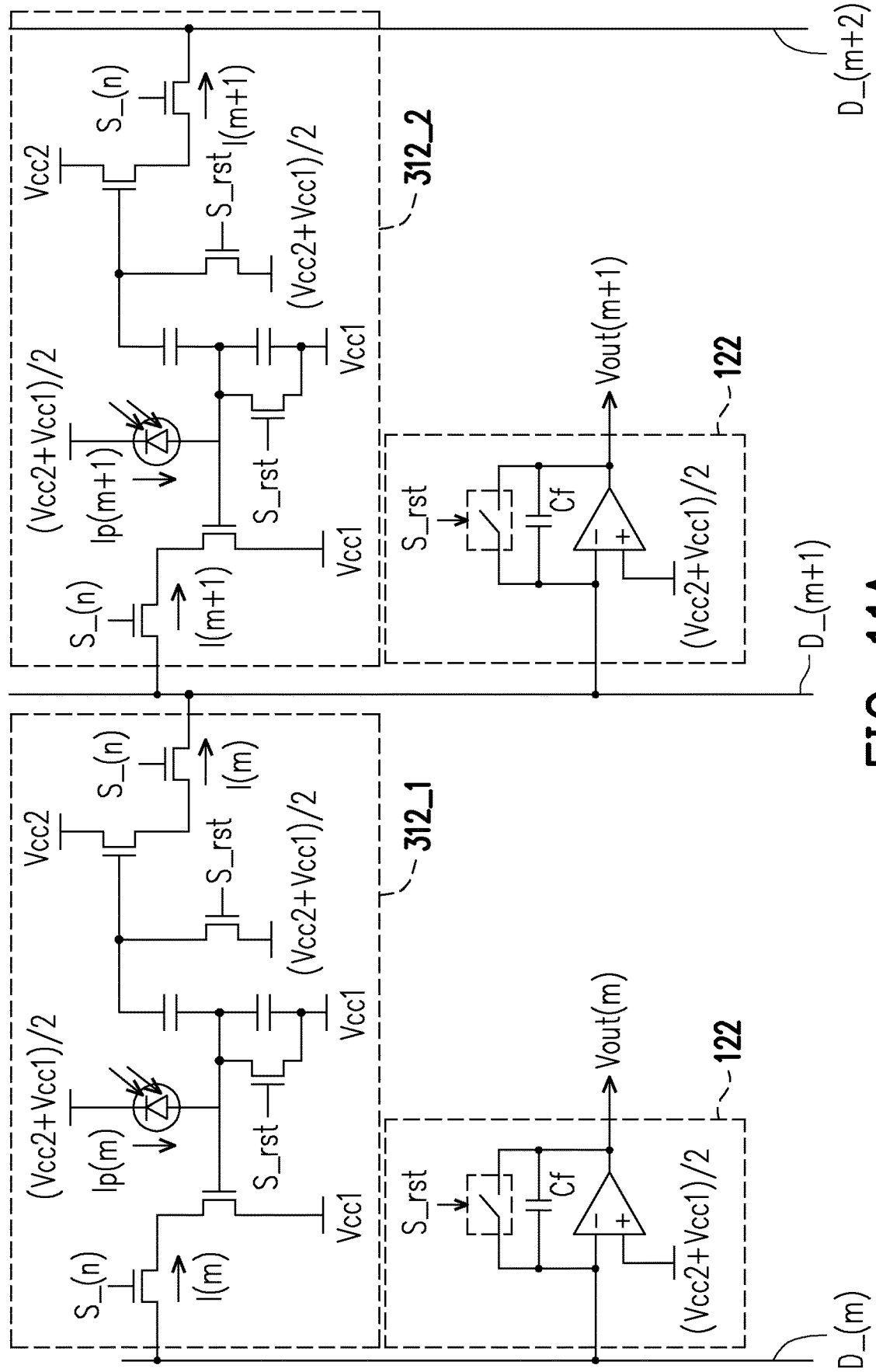
FIG. 11A illustrates a schematic diagram of a sensor array and a charge integrator according to another embodiment of the disclosure.
Figure 11B:
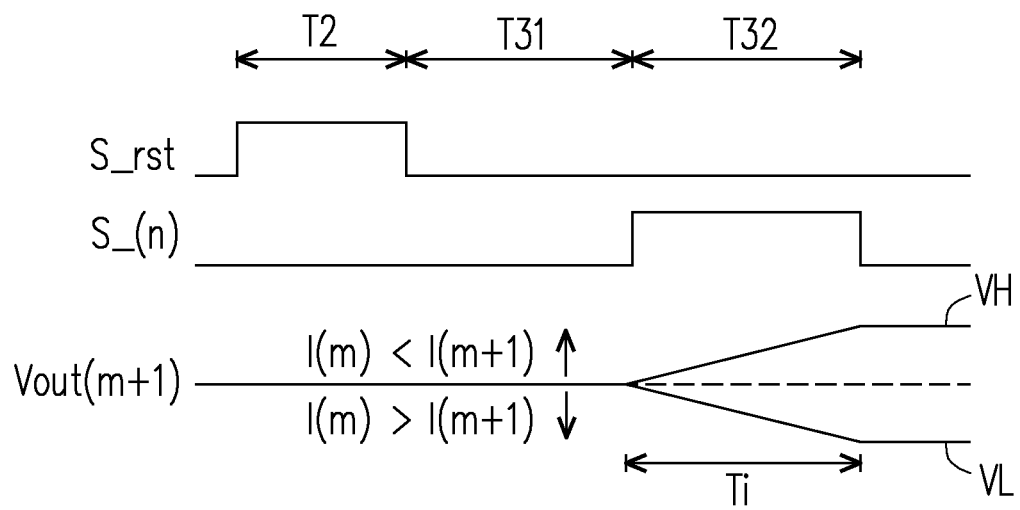
FIG. 11B illustrates a waveform diagram of signals depicted in FIG. 11A.

FIG. 11A illustrates a schematic diagram of a sensor array and a charge integrator according to another embodiment of the disclosure. FIG. 11B illustrates a waveform diagram of signals depicted in FIG. 11A. Referring to FIG. 11A and FIG. 11B, the sensor device 100 may be configured for optical sensing in an embodiment. Each of the sensor pixels 612_1 and 612_2 includes a current source and a current sink. The period T2 is a reset period. The period T31 is an exposure period, and the period T32 is a readout period. The output voltage Vout(m+1) can be calculated based on the formula: $Vout(m+1) = -[I(m)-I(m+1)] \times Ti/Cf$. The output voltage Vout(m+1) is a function of photocurrent difference. If absolute value of the sensing current I(m) is smaller than absolute value of the sensing current I(m+1), the output voltage Vout(m+1) reaches to a high voltage VH. If absolute value of the sensing current I(m) is larger than absolute value of the sensing current I(m+1), the output voltage Vout(m+1) reaches to a low voltage VL.

In summary, in some embodiments of the disclosure, for a data line, current source and current sink are arranged in the sensor array. For a data line, the current source to output current and the current sink to drain current. A summation of the currents through the data line is summarized into a sensing current and converted to voltage by a charge integrator. The converted voltage shows the sensed value difference between current source and current sink with eliminating common factor like offset and secondary parameter influence. For example, the photodiode current has light dependency as primary and temperature dependency as secondary and dark current as offset. Therefore, the architecture of the sensor device contributes sensing accuracy, spatial resolution improvement or cost reduction. In presented in pixel point of view, in other embodiments of the disclosure, for a data line, two types of sensor pixels are arranged in the sensor array. For a data line, one sensor pixel has a current source to output current and the other sensor pixel has a current sink to drain current. Both of the two types of sensor pixels share the same data line. A summation of the currents through the data line is summarized into a sensing current and converted to voltage by a charge integrator. The converted voltage shows the sensed value difference between two sensor pixels with eliminating common factor like offset and secondary parameter influence. For example, the photodiode current has light dependency as primary and temperature dependency as secondary and dark current as offset. Therefore, the architecture of the sensor device contributes sensing accuracy, spatial resolution improvement or cost reduction.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A sensor device, comprising:
   a data line;
   a first current source connected to the data line;
   a first current sink connected to the data line; and
   a charge integrator connected to the data line, receiving a first sensing current from the data line and outputting a first sensing voltage,
   wherein a current from the first current source to the charge integrator and a current from the charge integrator to the first current sink form the first sensing current, and the charge integrator converts the first sensing current into the first sensing voltage.

2. The sensor device of claim 1, wherein one of the first current source and the first current sink is located in a border area, and the other one of the first current source and the first current sink is located in an active area.

3. The sensor device of claim 1, wherein one of the first current source and the first current sink is for referencing, and the other one of the first current source and the first current sink is for sensing.

4. The sensor device of claim 1, wherein the first current source is connected to a first voltage source, the first current sink is connected to a second voltage source, and a voltage supplied by the first voltage source is higher than a voltage supplied by the second voltage source.

5. The sensor device of claim 1, wherein the current from the first current source to the charge integrator is a positive value, and the current from the first current sink to the charge integrator is a negative value.

6. The sensor device of claim 1, further comprising a first scan line and a second scan line, the first current source connected to the first scan line and the first current sink connected to the second scan line, wherein during a sensing period, the first scan line and the second scan line are simultaneously selected.

7. The sensor device of claim 6, further comprising a first pixel, wherein the first pixel comprises the first current source and the first current sink.

8. The sensor device of claim 6, further comprising a first pixel and a second pixel, wherein the first pixel comprises the first current source, and the second pixel comprises the first current sink.

9. The sensor device of claim 8, wherein the first pixel further comprises a second current sink, and the second pixel further comprises a second current source.

10. The sensor device of claim 8, wherein the first pixel and the second pixel comprise a photodiode sensor, an X-ray sensor, a thermal sensor, or a capacitive sensor respectively.

11. The sensor device of claim 8, wherein the first pixel and the second pixel further comprise at least one transistor respectively.

12. The sensor device of claim 1, further comprising a first scan line, wherein the first current source and the first current sink are connected to the first scan line.

13. The sensor device of claim 12, further comprising a first pixel, wherein the first pixel comprises the first current source and the first current sink.

14. The sensor device of claim 12, further comprising a first pixel and a second pixel, wherein the first pixel comprises the first current source, and the second pixel comprises the first current sink.

15. The sensor device of claim 14, wherein the first pixel further comprises a second current sink, and the second pixel further comprises a second current source.

16. The sensor device of claim 14, wherein the first pixel and the second pixel further comprise at least one transistor respectively.

17. The sensor device of claim 1, wherein one of the first current source and the first current sink is shielded, and the other one of the first current source and the first current sink is exposed.

18. The sensor device of claim 1, wherein the first current source is adjacent to the first current sink.

19. A method for operating a sensor device, the sensor device comprising a data line, a first scan line, a second scan line, a current source connected to the data line and the first scan line, a current sink connected to the data line and the second scan line and a charge integrator connected to the data line, the method comprising:
   simultaneously selecting the first scan line and the second scan line;
   receiving a sensing current by the charge integrator, wherein a current from the current source to the charge integrator through the data line and a current from the charge integrator to the current sink through the data line form the sensing current; and
   outputting a sensing voltage by the charge integrator related to the sensing current, wherein the charge integrator converts the sensing current into the sensing voltage.

20. A method for operating a sensor device, the sensor device comprising a data line, a scan line, a current source connected to the data line and the scan line, a current sink connected to the data line and the scan line, and a charge integrator connected to the data line, the method comprising:
   scanning the scan line;
   receiving a sensing current by the charge integrator, wherein a current from the current source to the charge integrator through the data line and a current from the charge integrator to the current sink through the data line form the sensing current; and
   outputting a sensing voltage by the charge integrator related to the sensing current, wherein the charge integrator converts the sensing current into the sensing voltage.

* * * * *